United States Patent
Schlom et al.

(10) Patent No.: US 11,678,587 B2
(45) Date of Patent: Jun. 13, 2023

(54) FERROELECTRIC AND MULTIFERROIC MATERIAL STRUCTURES

(71) Applicant: Cornell University, Ithaca, NY (US)

(72) Inventors: Darrell Schlom, Ithaca, NY (US); Rachel Steinhardt, Brooktondale, NY (US); Megan Holtz, Washington, DC (US)

(73) Assignee: Cornell University, Ithaca, NY (US)

( * ) Notice: Subject to any disclaimer, the term of this patent is extended or adjusted under 35 U.S.C. 154(b) by 107 days.

(21) Appl. No.: 17/076,131

(22) Filed: Oct. 21, 2020

(65) Prior Publication Data

US 2021/0119112 A1  Apr. 22, 2021

Related U.S. Application Data

(60) Provisional application No. 62/924,127, filed on Oct. 21, 2019.

(51) Int. Cl.
*H10N 50/80* (2023.01)
*G11C 11/16* (2006.01)
*H10B 61/00* (2023.01)
*H10N 50/01* (2023.01)
*H10N 50/85* (2023.01)

(52) U.S. Cl.
CPC ........... *H10N 50/80* (2023.02); *G11C 11/161* (2013.01); *H10B 61/22* (2023.02); *H10N 50/01* (2023.02); *H10N 50/85* (2023.02)

(58) Field of Classification Search
CPC ..... G11C 11/221; G11C 11/161; H01L 43/02; H01L 27/228
See application file for complete search history.

(56) References Cited

U.S. PATENT DOCUMENTS

2005/0122005 A1* 6/2005 Higuchi ............ B41J 2/1629
  257/E21.272
2016/0155850 A1* 6/2016 Yamazaki ......... H01L 29/78603
  257/43

OTHER PUBLICATIONS

Roberto Vargas et al., Epitaxial growth of iridium and platinum films on sapphire by metalorganic chemical vapor deposition, Appl. Phys. Lett. 65, 1094 (1994) (Year: 1994).*
Seung Yup Jang et al., Ferroelectric Properties of Multiferroic Hexagonal ErMnO3 Thin Films, Journal of the Korean Physical Society, vol. 55, No. 2, Aug. 2009, pp. 841-845 (Year: 2009).*
Young Kyu Jeong et al., Epitaxially Constrained Hexagonal Ferroelectricity and Canted Triangular Spin Order in LuFeO3 Thin Films , Chem. Mater. 2012, 24, 2426-2428 (Year: 2012).*
Bossak, A. A. et al., "XRD and HREM Studies of Epitaxially Stabilized Hexagonal Orthoferrites RFeO3 (R=Eu—Lu)," Chem. Mater., vol. 16, Mar. 31, 2004, American Chemical Society, pp. 1751-1755.

(Continued)

*Primary Examiner* — Shih Tsun A Chou
(74) *Attorney, Agent, or Firm* — Withrow & Terranova, P.L.L.C.; Vincent K. Gustafson

(57) ABSTRACT

A ferroelectric device includes a substrate, a first electrode on the substrate, and a hexagonal ferroelectric material on the first electrode. The first electrode comprises a single crystal epitaxial material. By using a single crystal epitaxial material for an electrode to a hexagonal ferroelectric material, a high-quality material interface may be provided between these layers, thereby improving the performance of the ferroelectric device by allowing for a reduced coercive field.

17 Claims, 19 Drawing Sheets

(56) References Cited

OTHER PUBLICATIONS

Cha, S. Y. et al., "Iridium thin film as a bottom electrode for high dielectric (Ba,Sr)TiO3 capacitors," Integr. Ferroelectr., vol. 17, 1997, pp. 187-195.
Dawber, M. et al., "Unusual Behavior of the Ferroelectric Polarization in PbTiO3/SrTiO3 Superlattices," Physical Review Letters, vol. 95, iss. 17, Oct. 21, 2005, pp. 177601-1-177601-4.
Fennie, C. J. et al., "Ferroelectric transition in YMnO3 from first principles," Phys. Rev. B—Condens. Matter Mater. Phys. (2005). doi:10.1103/PhysRevB.72.100103.
Fong, D. et al., "Ferroelectricity in Ultrathin Perovskite Films," Science, vol. 304, No. 5677, Jun. 11, 2004, pp. 1650-1653.
Fukumura, H. et al. Raman scattering studies on multiferroic YMnO3. J. Phys. Condens. Matter (2007). doi:10.1088/0953-8984/19/36/365239.
Gsell, S., Bauer, T., Goldfuß, J., Schreck, M. & Stritzker, B. A route to diamond wafers by epitaxial deposition on silicon via iridium/ yttria-stabilized zirconia buffer layers. Appl. Phys. Lett. (2004). doi:10.1063/1.1758780.
Gsell, S. et al. Reduction of mosaic spread using iridium interlayers: A route to improved oxide heteroepitaxy on silicon. Appl. Phys. Lett. (2007). doi:10.1063/1.2768003.
Han, T. C. & Lin, J. G. Multiferroic Properties of Hexagonal YbMnO3 Thin Films. IEEE Transactions on Magnetics (2009). doi:10.1109/TMAG.2009.2023423.
Horita, S., Horii, S., Nakajima, H. & Umemoto, S. Crystalline and ferroelectrical properties of heteroepitaxial (100) and (111) Pb(ZrxTi1-x)O3 films on Ir/(100)(ZrO2)1-x(Y2O3)x/(100)Si structures. Thin Solid Films 388, (2001).
Ingel, R. P. & III, D. L. Lattice Parameters and Density for Y2O3-Stabilized ZrO2. J. Am. Ceram. Soc. (1986). doi:10.1111/j.1151-2916.1986.tb04741.x.
Jang, S. Y., Lee, D., Lee, J.-H., Murugavel, P. & Chung, J.-S. Ferroelectric Properties of Multiferroic Hexagonal ErMnO3 Thin Films. J. Korean Phys. Soc. (2009). doi:10.3938/jkps.55.841.
Jeong, Y. K., Lee, J. H., Ahn, S. J. & Jang, H. M. Epitaxially Constrained Hexagonal Ferroelectricity and Canted Triangular Spin Order in LuFeO 3 Thin Films. Chem. Mater. (2012). dx.doi.org/10.1021/cm300846j.
Jeong, Y. K. et al. Structurally Tailored Hexagonal Ferroelectricity and Multiferroism in Epitaxial YbFeO 3 Thin-Film Heterostructures. J. Am. Chem. Soc. (2012). doi:10.1021/ja210341b.
Junquera, J. & Ghosez, P. Critical thickness for ferroelectricity in perovskite ultrathin films. Nature 422, 506-509 (2003). doi:10.1038/nature01499.
Mundy, J. A. et al. Atomically engineered ferroic layers yield a room-temperature magnetoelectric multiferroic. Nature (2016). doi:10.1038/nature19343.
Murugavel, P. et al. Physical properties of multiferroic hexagonal HoMn O3 thin films. Appl. Phys. Lett. (2007). doi:10.1063/1.2718512.
Nakamura, T., Nakao, Y., Kamisawa, A. & Takasu, H. Preparation of Pb(Zr,Ti)O3 thin films on electrodes including IrO2. Appl. Phys. Lett. (1994). doi:10.1063/1.112031.
N'Diaye, A. T., Coraux, J., Plasa, T. N., Busse, C. & Michely, T. Structure of epitaxial graphene on Ir(111). New J. Phys. (2008). doi:10.1088/1367-2630/10/4/043033.
Ohtsuka, K., Suzuki, K., Sawabe, A. & Inuzuka, T. Epitaxial growth of diamond on iridium. Japanese J. Appl. Physics, Part 2 Lett. (1996). doi:10.1143/JJAP.35.L1072.
Ramesh, R. et al. Fatigue and retention in ferroelectric Y-Ba-Cu-O/Pb-Zr-Ti-O/Y-Ba-CuO heterostructures. Appl. Phys. Lett. (1992). doi:10.1063/1.107488.
Sai, N., Fennie, C. J. & Demkov, A. A. Absence of critical thickness in an ultrathin improper ferroelectric film. Phys. Rev. Lett. (2009). doi:10.1103/PhysRevLett.102.107601.
Tenne, D. A. et al. Probing Nanoscale Ferroelectricity by Ultraviolet Raman Spectroscopy. Science Magazine, vol. 33, pp. 1614-1616 (2006). doi:10.1126/science.1130306.
Vargas, R., Goto, T., Zhang, W. & Hirai, T. Epitaxial growth of iridium and platinum films on sapphire by metalorganic chemical vapor deposition. Appl. Phys. Lett. 65, 1094 (1994). doi:10.1063/1.112108.

\* cited by examiner

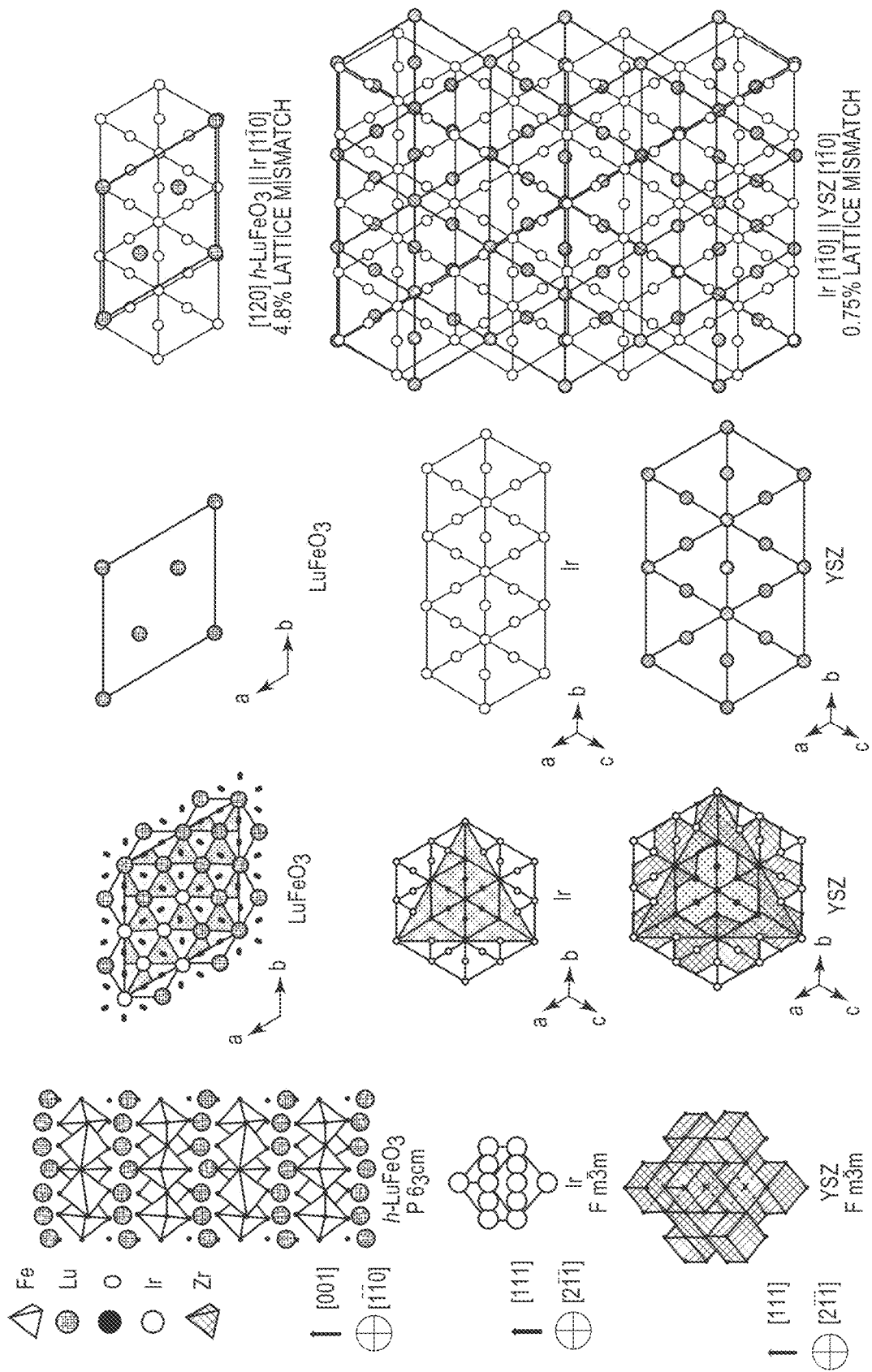

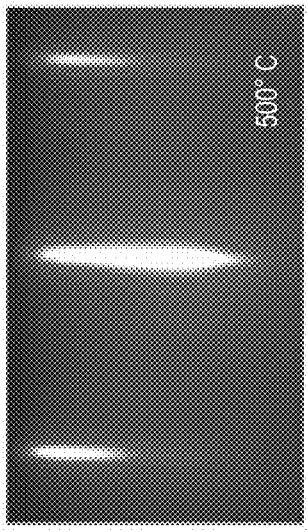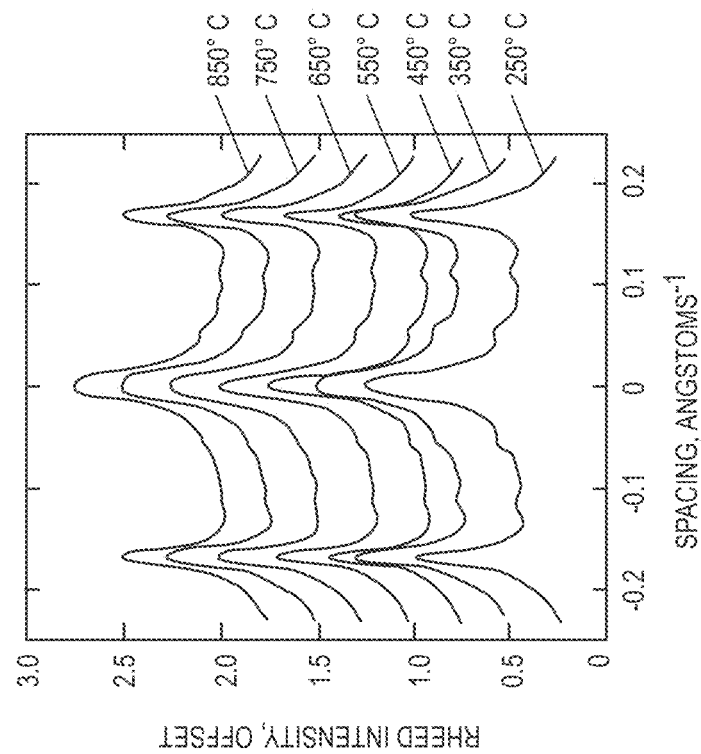
FIG. 6A
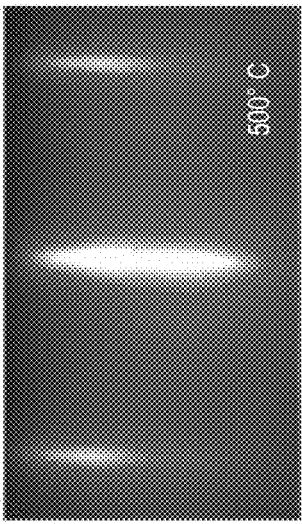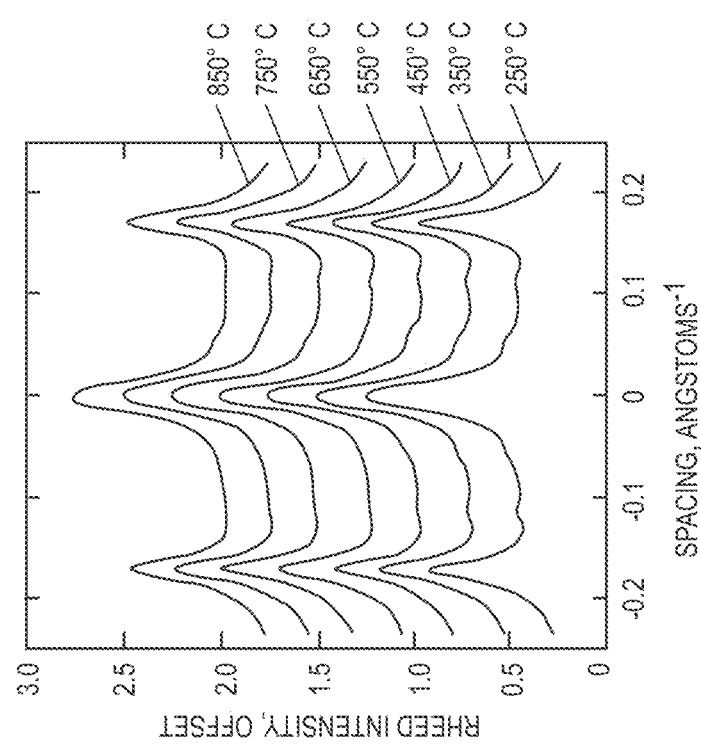
FIG. 6B

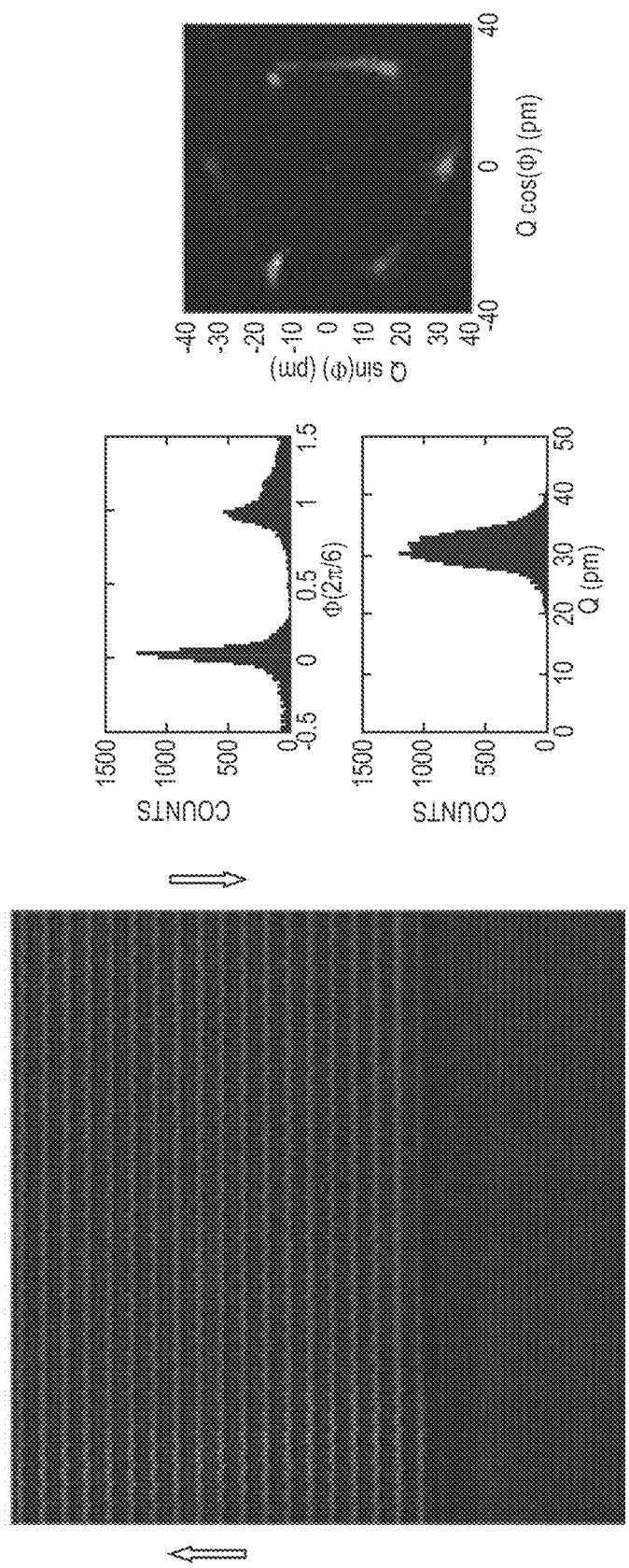

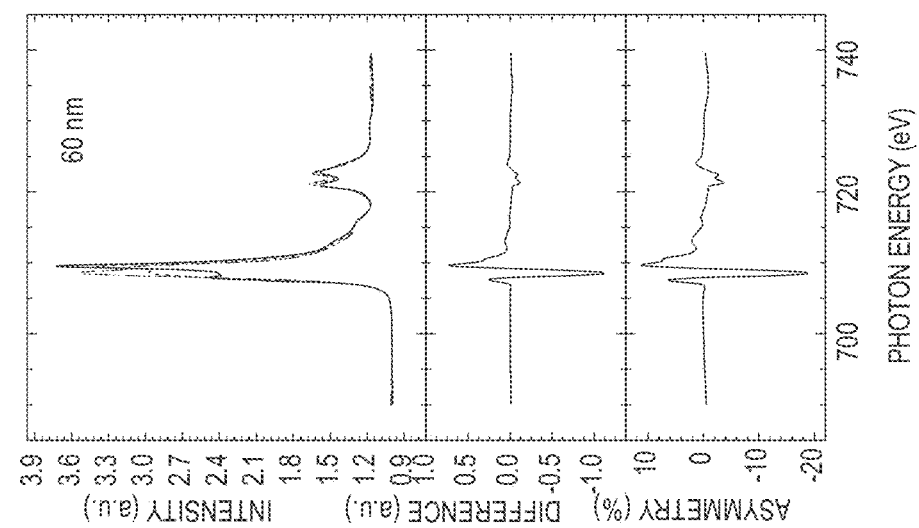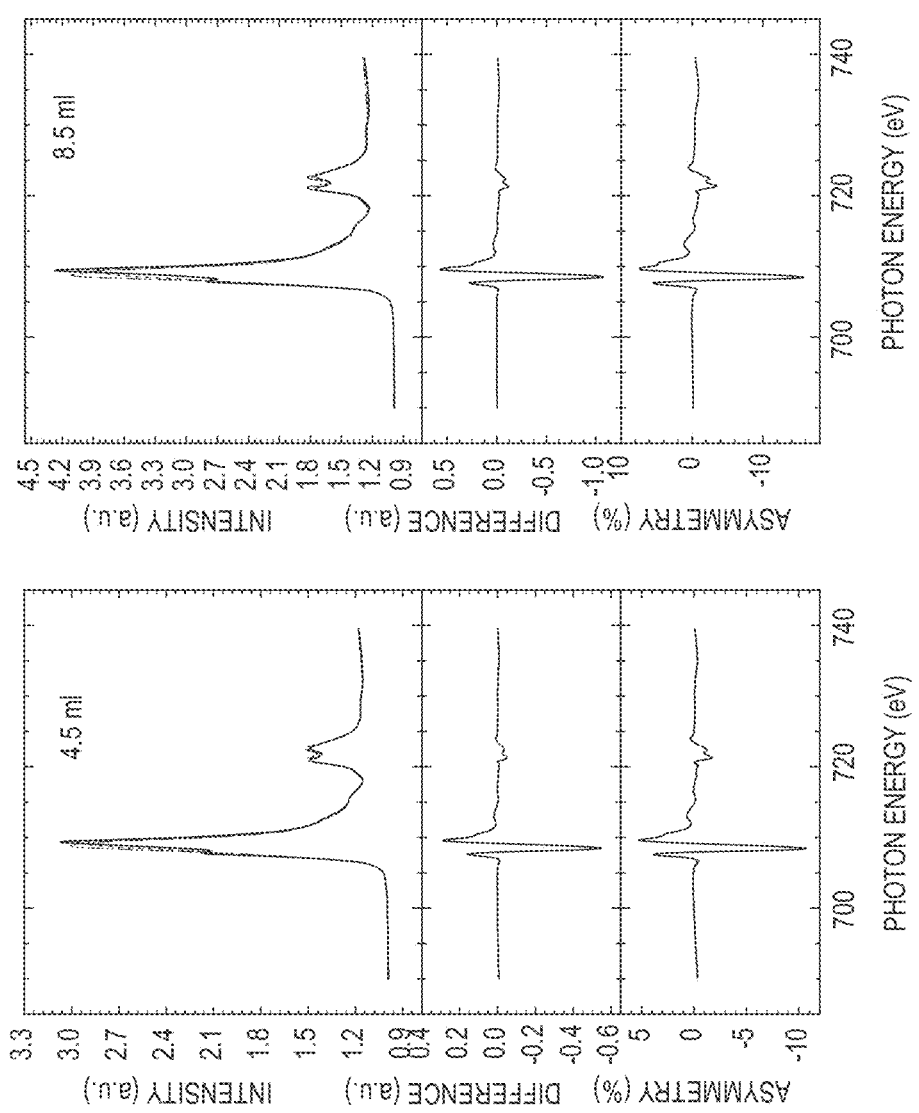
FIG. 13G  FIG. 13H  FIG. 13I

US 11,678,587 B2

FERROELECTRIC AND MULTIFERROIC MATERIAL STRUCTURES

RELATED APPLICATIONS

This application claims the benefit of provisional patent application Ser. No. 62/924,127, filed Oct. 21, 2019, the disclosure of which is hereby incorporated herein by reference in its entirety.

GOVERNMENT SUPPORT

This invention was made with government funds under Agreement No. HR0011-18-3-0004 awarded by The Defense Advanced Research Projects Agency (DARPA). The U.S. Government has certain rights in this invention.

FIELD OF THE DISCLOSURE

The present disclosure is related to ferroelectric and multiferroic materials, and in particular to improved material structures and interfaces for ferroelectric and multiferroic materials.

BACKGROUND

Ferroelectric and multiferroic materials are used in many functional devices such as low-power non-volatile memories and logic circuitry. In general, these functional devices require high quality ferroelectric and multiferroic materials with finely tuned electric and magnetic properties. To provide functional devices, supporting structures (e.g., electrodes) must be provided to interface the ferroelectric and multiferroic materials. Often, these supporting structures can negatively impact desirable properties of ferroelectric and multiferroic materials. Accordingly, there is a need for high quality ferroelectric and multiferroic materials and supporting structures for interfacing the materials.

SUMMARY

In one embodiment, a ferroelectric device includes a substrate, a first electrode on the substrate, and a hexagonal ferroelectric material on the first electrode. The first electrode comprises a single crystal epitaxial material. By using a single crystal epitaxial material for an electrode to a hexagonal ferroelectric material, a high-quality material interface may be provided between these layers, thereby improving the performance of the ferroelectric device by allowing for a reduced coercive field.

In one embodiment, the hexagonal ferroelectric material comprises hexagonal $LuFeO_3$. The first electrode comprises iridium. The substrate comprises yttria-stabilized zirconia (YSZ). The combination of these materials may provide very good lattice matching resulting in ferroelectricity at very low thicknesses of the hexagonal ferroelectric layer, which in turn may allow for very low coercive field values and thus energy efficient devices.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A through 2D are diagrams illustrating the crystal structures of materials for various layers of a ferroelectric device according to one embodiment of the present disclosure.

FIGS. 6A and 6B are images and graphs illustrating the performance of a ferroelectric device according to one embodiment of the present disclosure.

Figure 7:
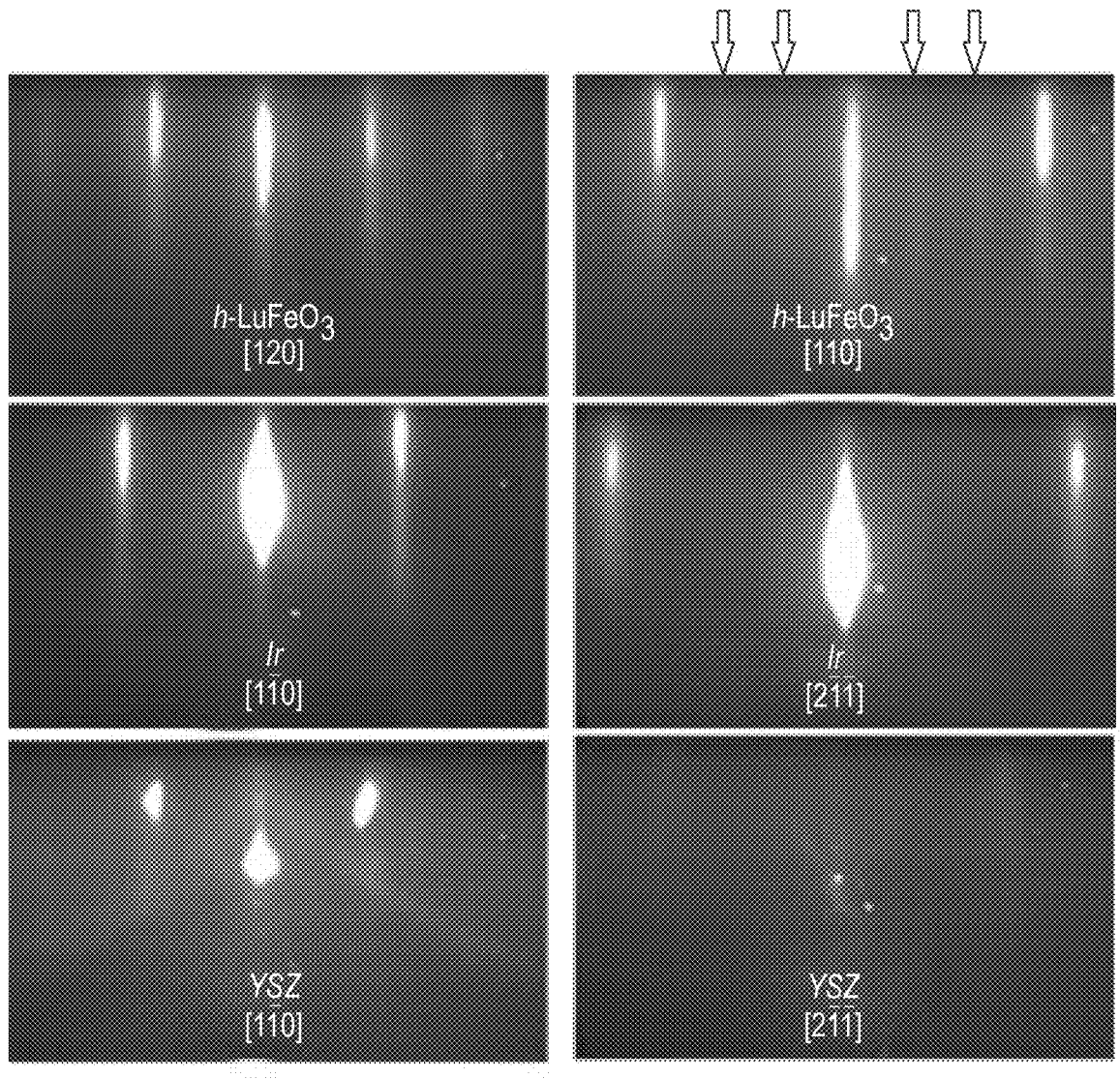

FIG. 7 includes several pictures illustrating the performance of a ferroelectric device according to one embodiment of the present disclosure.

Figure 8C:
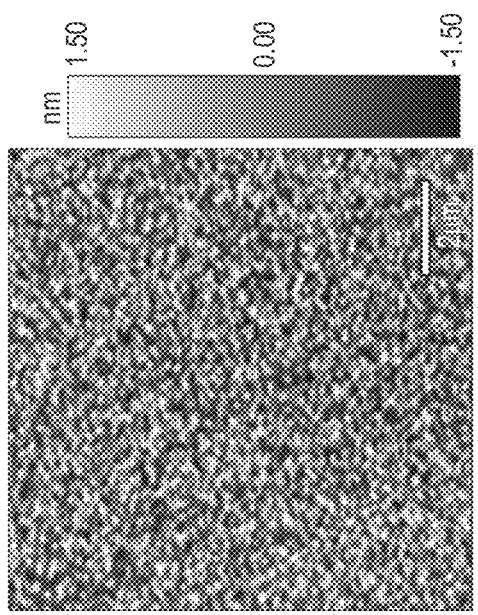
Figure 8B:
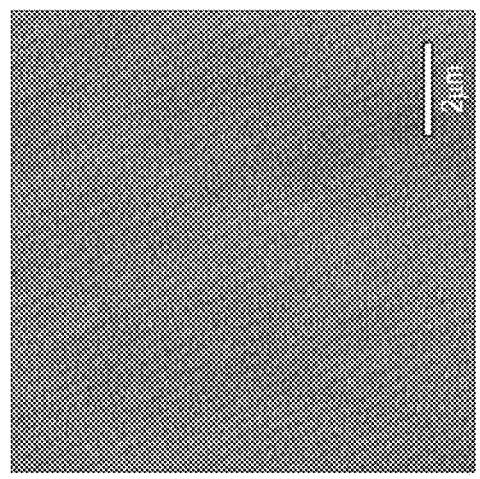
Figure 8A:
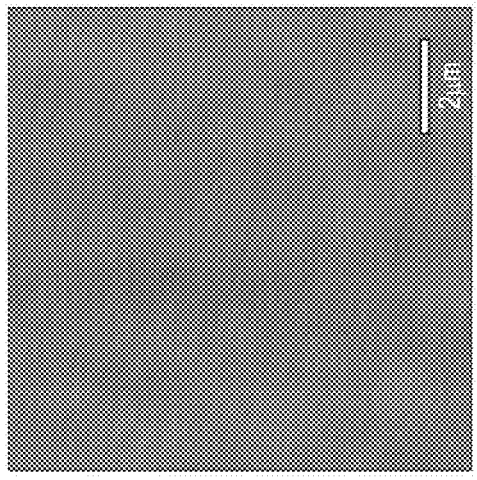

FIGS. 8A through 8C are images illustrating the surfaces of various layers of a ferroelectric device according to one embodiment of the present disclosure.

Figures 9A, 9B, 9C:
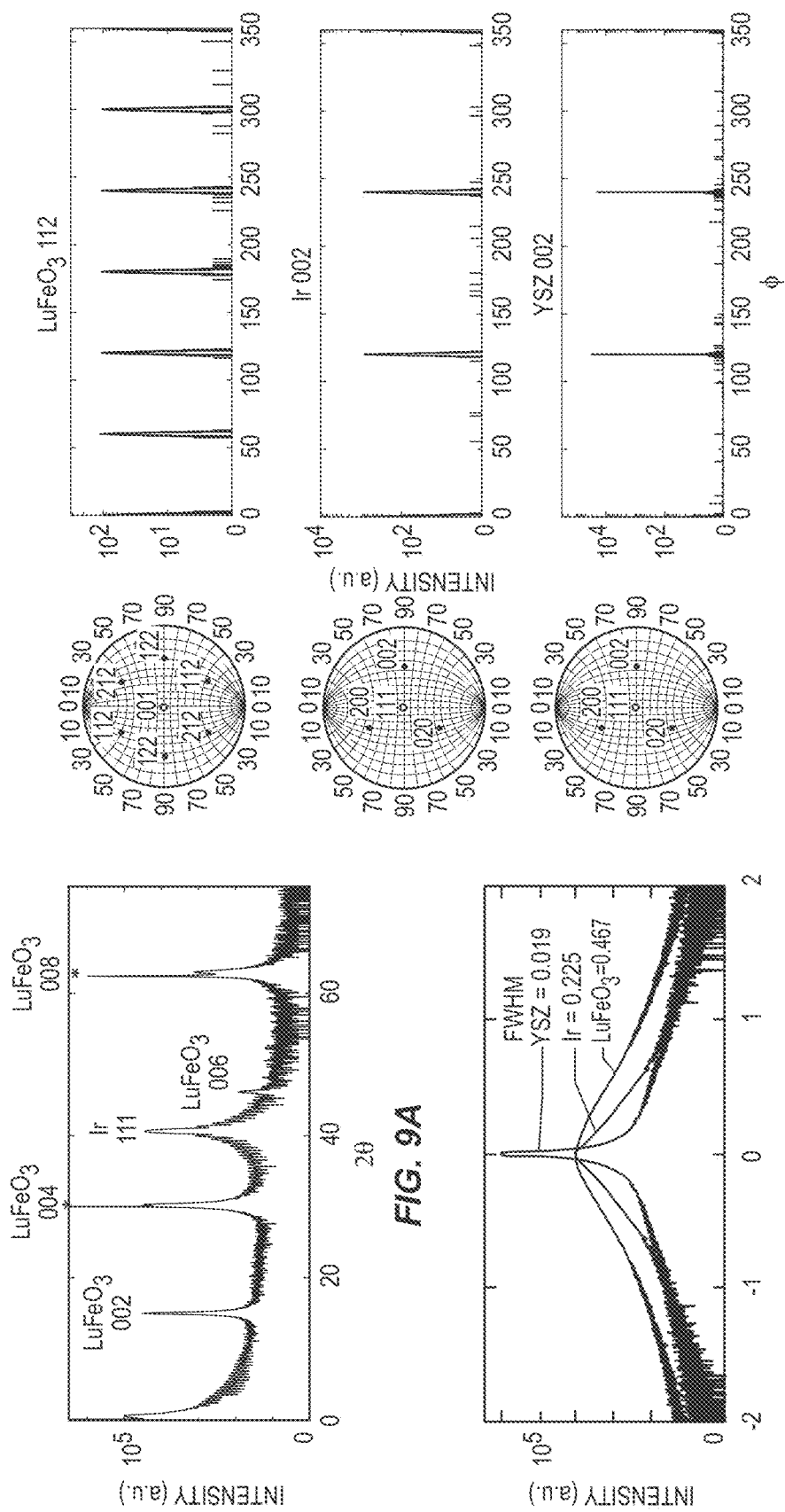

FIGS. 9A through 9C are graphs illustrating the performance of a ferroelectric device according to one embodiment of the present disclosure.

Figure 10A:
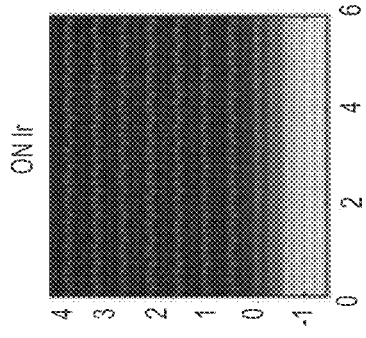
Figure 10B:
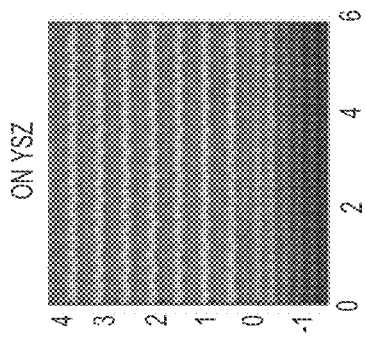

FIGS. 10A and 10B are pictures illustrating the structure of ferroelectric devices according to various embodiments of the present disclosure.

Figure 10C:
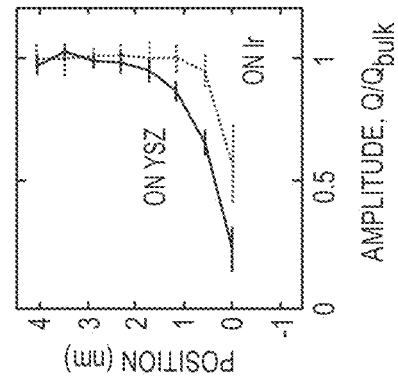
Figure 10D:
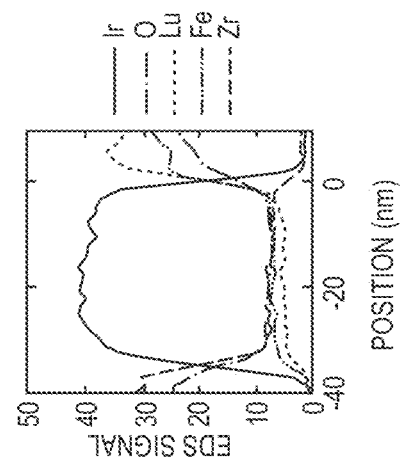

FIGS. 10C and 10D are graphs illustrating the performance of ferroelectric devices according to various embodiments of the present disclosure.

FIG. 11A is a picture illustrating the polarization of a ferroelectric device according to one embodiment of the present disclosure. FIG. 11B includes graphs illustrating the performance of a ferroelectric device according to one embodiment of the present disclosure. FIG. 11C is a picture illustrating the polarization of a ferroelectric device according to one embodiment of the present disclosure.

Figure 12:
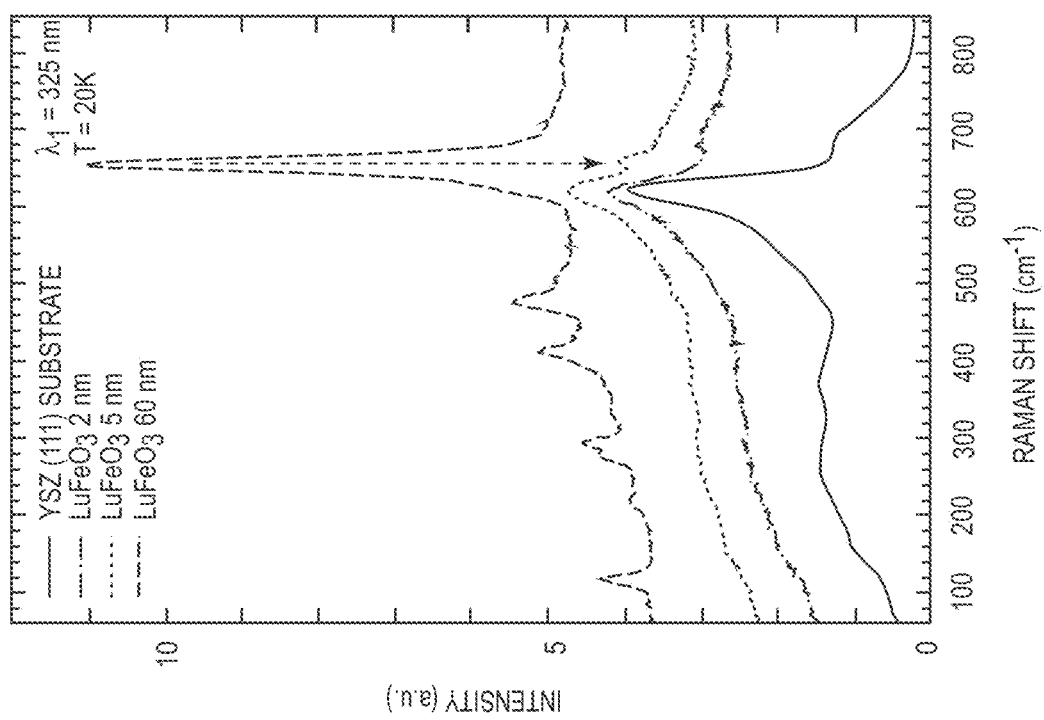

FIG. 12 is a graph illustrating the performance of a ferroelectric device according to one embodiment of the present disclosure.

Figures 13A, 13B, 13C:
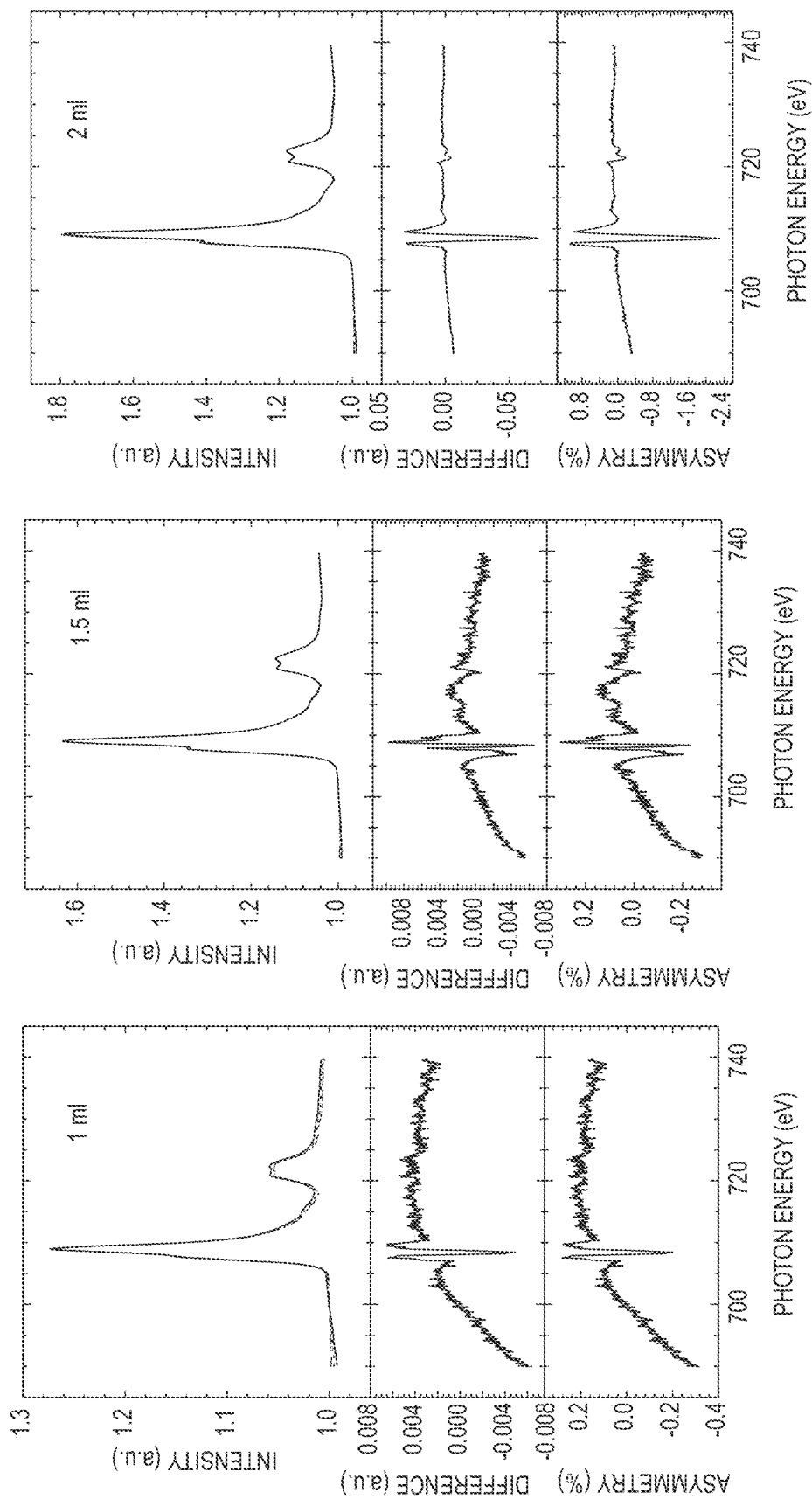
Figure 13F:
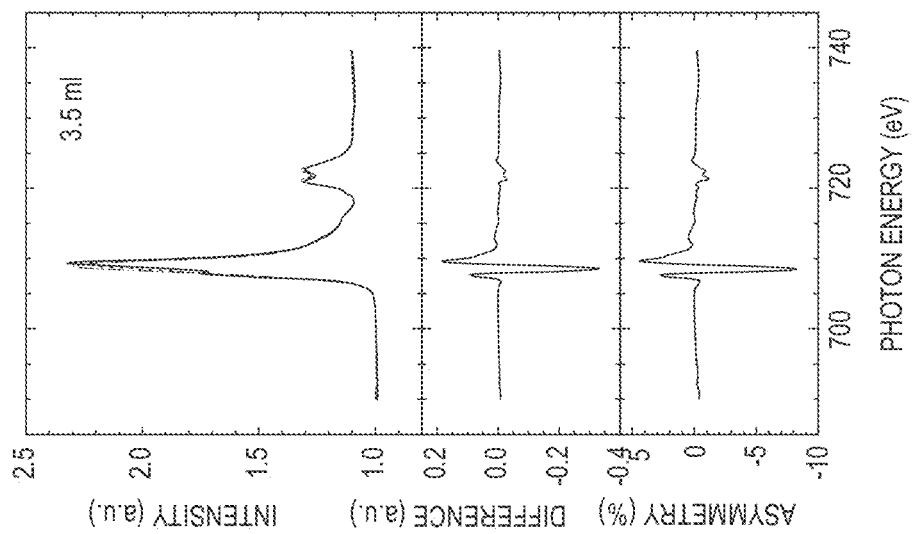
Figure 13E:
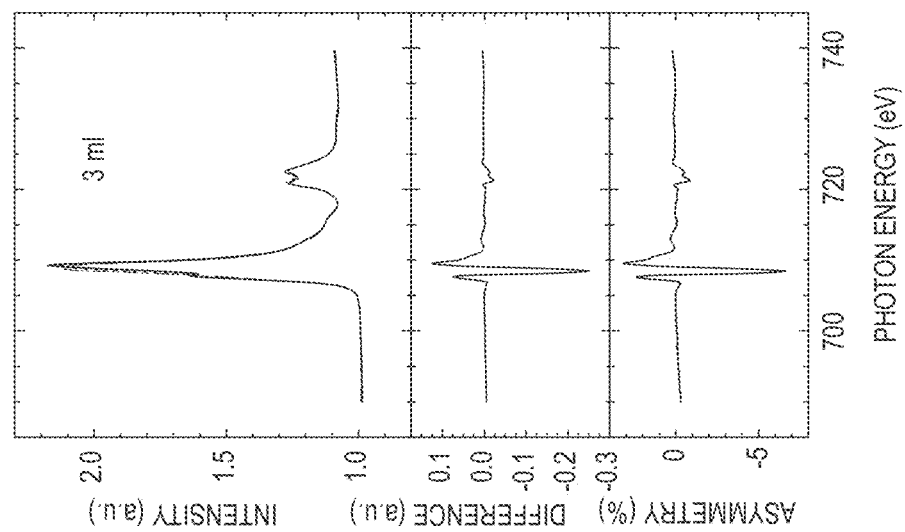
Figure 13D:
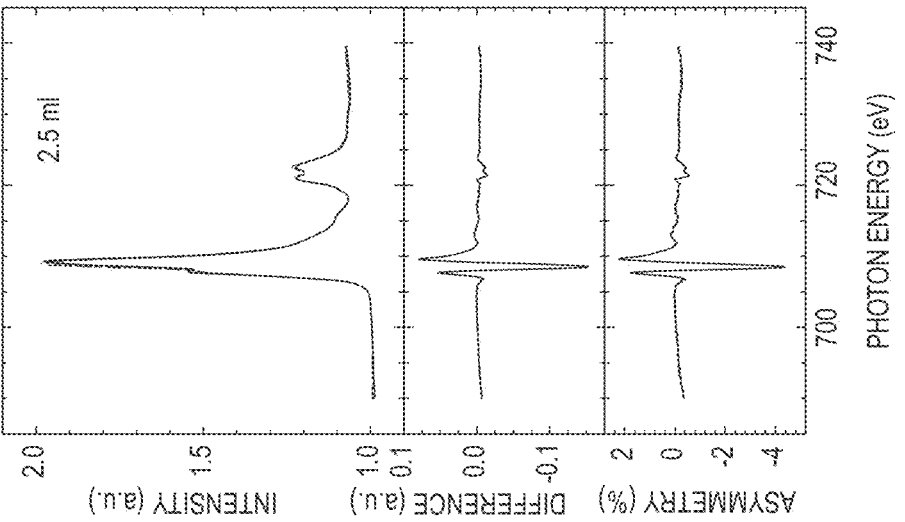

FIGS. 13A though 13I are a series of graphs illustrating the performance of ferroelectric devices according to various embodiments of the present disclosure.

Figure 14:
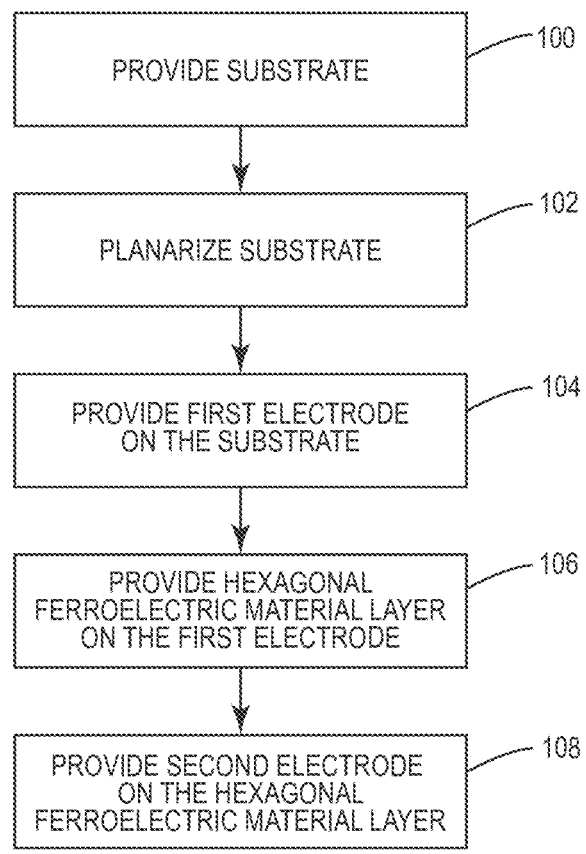

FIG. 14 is a flow diagram illustrating a method for manufacturing a ferroelectric device according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1:
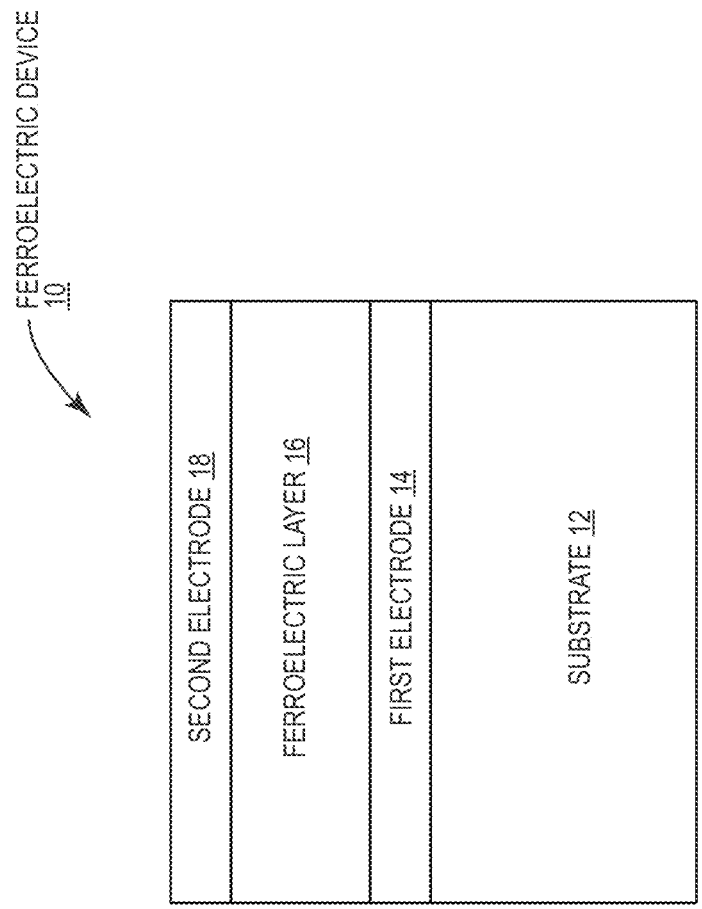
FIG. 1 is a diagram illustrating a cross-sectional view of a ferroelectric device according to one embodiment of the present disclosure.

FIG. 1 is a cross-sectional view of an exemplary ferroelectric device 10 according to one embodiment of the present disclosure. The exemplary ferroelectric device 10 includes a substrate 12, a first electrode 14 on the substrate 12, a ferroelectric layer 16 on the first electrode 14, and a second electrode 18 on the ferroelectric layer 16 such that the ferroelectric layer 16 is between the first electrode 14 and the second electrode 18 to form a metal-insulator-metal (MIM) capacitor. The exemplary ferroelectric device 10 may be a building block of more complex circuitry to form functional devices such as non-volatile memories and logic. Those skilled in the art will appreciate that the principles of the present disclosure are not limited to structures identical to that shown in the exemplary ferroelectric device 10, but rather are broadly applicable to any devices including ferroelectric materials.

Many factors affect the operation of the exemplary ferroelectric device 10. Among these are the material of the substrate 12, the first electrode 14, the second electrode 18, and the ferroelectric layer 16, the thickness of the ferroelectric layer 16, and the material interfaces between the substrate 12, the first electrode 14, the ferroelectric layer 16, and the second electrode 18. Two operational parameters of note include the temperature $T_c$ under which the ferroelectric layer 16 exhibits ferroelectricity and the coercive field $E_c$, which is the strength of the electric field necessary to switch the polarization of the ferroelectric layer 16. To reduce power consumption of the exemplary ferroelectric device 10, it is desirable to minimize the coercive field $E_c$. To ensure ferroelectricity during normal operation, the temperature $T_c$ should be above room temperature.

As discussed in detail below, providing the exemplary ferroelectric device 10 wherein the substrate 12 comprises yttria-stabilized zirconia (YSZ), the first electrode 14 and the second electrode 18 comprise iridium, and the ferroelectric layer 16 comprises h-LuFeO$_3$ reduces the coercive field $E_c$ beyond what has previously been possible by allowing a thickness of the ferroelectric material 16 to be reduced significantly while maintaining ferroelectric properties at room temperature. In some embodiments, the substrate 12 may comprise (111) oriented YSZ, the first electrode 14 and the second electrode 18 may comprise (111) oriented iridium, and the ferroelectric layer 16 may comprise h-LuFeO$_3$ in a monolayer-by-monolayer sequence as the layers occur along the direction of h-LuFeO$_3$. A thickness of the substrate 12 may be between 300 µm and 1 mm. A thickness of the first electrode 14 and the second electrode 18, respectively, may be between 1 nm and 100 nm. A thickness of the ferroelectric layer 16 may be between 1 nm and 1 μm. Notably, the present disclosure contemplates not only the range of thicknesses listed above for each one of the substrate 12, the first electrode 14, the second electrode 18, and the ferroelectric layer 16, but any individual thickness for each one of these layers within the ranges listed above.

More generally, the principles of the present disclosure contemplate using a single crystal epitaxial electrode along with a hexagonal ferroelectric material in order to provide improved performance of ferroelectric devices. While iridium and h-LuFeO$_3$ are examples of each of these materials, respectively, the present disclosure contemplates the use of other materials that fit within these categories as well.

Most ferroelectric materials employed in devices such as the exemplary ferroelectric device 10 are proper ferroelectrics, where the primary order parameter is the spontaneous polarization. Improper ferroelectrics, on the other hand, have a polar order that emerges as a result of a primary order parameter other than the polarization, such as a structural distortion, and as a result the stability and switching dynamics of the polar state are less well understood. Because the primary order parameter for the transition is not polarization, this opens pathways towards exciting possibilities such as coupling ferroelectricity through a structural distortion with magnetism, circumventing the electronic incompatibility between ferroelectricity (broken inversion symmetry) and magnetism (broken time reversal symmetry) that is pervasive in proper ferroelectrics. For example, in the hexagonal manganites exemplified by YMnO$_3$, a trimerization distortion drives ferroelectricity and has recently been incorporated to make room-temperature multiferroic/magnetoelectric superlattices utilizing the isostructural hexagonal ferrite, h-LuFeO$_3$.

In proper ferroelectrics, both theoretical and experimental studies have revealed a thickness dependence of the stability and switchability of the polar order parameter. In all cases, a strong suppression of the polar order parameter is observed as the thickness is reduced as a consequence of the depoling field dominating the polar order, consistent with theoretical predictions. For superlattices, e.g., PbTiO$_3$/SrTiO$_3$ and BaTiO$_3$/SrTiO$_3$, ferroelectricity exists down to ferroelectric layers as thin as just one unit cell, as a consequence of the emergence of an improper ferroelectric state in the SrTiO$_3$ layer due to oxygen octahedral tilting, in contrast to the corresponding case of the PbTiO$_3$ layer encapsulated between metal electrodes.

Size effects also manifest in the switching dynamics of such proper ferroelectrics, in the form of a "universal" thickness, t, scaling of the coercive field, $E_c$, known as the Janovec-Kay-Dunn law, through the relationship $E_c \propto t^{-2/3}$. In contrast, far less is known about size effects of the stability of the order parameter as well as the energetics of the switching process in improper ferroelectrics. Important open questions for these improper ferroelectrics are: (1) What is the intrinsic coercive field, $E_c$, required to switch the ferroelectric? (2) How does the coercive field $E_c$ scale with thickness? and (3) What is the minimum thickness down to which ferroelectricity exists?

The first question regarding the intrinsic coercive field has been studied across a range of hexagonal ferrite and manganite improper ferroelectrics, but the values of the coercive field $E_c$ reported vary greatly. Extrinsic factors, such as resistive leakage, can impact the experimentally measured coercive field $E_c$. To more accurately determine the value for the coercive field $E_c$, it is necessary to provide a high-quality electrode-ferroelectric interface. To accomplish this, single crystals prepared in the form of epitaxial thin films can be utilized for the electrodes as discussed herein.

For the second question, the thickness dependence of the switching field for h-LuFeO$_3$ is significantly different from proper ferroelectrics such as PbTiO$_3$, BaTiO$_3$ and the well-established Janovec-Kay-Dunn law as discussed below.

The third question regarding the minimum thickness down to which ferroelectricity exists has been investigated by first-principles calculations for the improper ferroelectric YMnO$_3$ and the results show that ferroelectricity is stable down to a thickness of two unit cells—the thinnest film that could be simulated. The unit cell of h-LuFeO$_3$, which is isostructural to YMnO$_3$, is outlined on the crystal structure shown at the top of FIG. 2A, where the growth direction is toward the top of the page. FIG. 2A further illustrates the crystal structure of iridium at the middle and yttria-stabilized zirconia (YSZ) at the bottom. Note that each unit cell of h-LuFeO$_3$ contains two LuO$_2$ and two FeO monolayers along the c-axis direction of h-LuFeO$_3$. Recent experimental work on YMnO$_3$ has shown that improper ferroelectricity disappears at a thickness of 2 unit cells at room temperature. This is attributed to the clamping effect of the underlying substrate. In contrast, improper ferroelectricity can exist in h-LuFeO$_3$ films below this limit by using an in-situ-grown epitaxial iridium electrode that allows the broken inversion symmetry to exist in the first unit cell as discussed in detail below. This can be verified through a combination of scanning transmission electron microscopy (STEM) measurements of the order parameter, X-ray linear dichroism (XLD) measurements of symmetry breaking, and in-situ reflection high-energy electron diffraction (RHEED) showing the onset of the ferroelectric phase.

LuFeO$_3$ forms a non-polar perovskite structure in bulk, but a polar hexagonal P6$_3$ cm polymorph, isostructural to YMnO$_3$, can be stabilized using epitaxy. This hexagonal polymorph of LuFeO$_3$, h-LuFeO$_3$, is a geometric ferroelectric in which the ferroelectricity originates from tilting of the oxygen coordination polyhedra surrounding the iron ions, trigonal bipyramids in this case, resulting in a rumpling of lutetium positions in the lutetium-oxygen layers that alternate with the iron-oxygen layers along the c-axis of h-LuFeO$_3$. As the atomic structure of h-LuFeO$_3$ in FIG. 2A depicts, the lutetium displaces along the c-axis, forming a rumpled plane with either two lutetium ions up and one down or vice versa. Since the lutetium ions are charged, this geometric distortion creates a net polarization along the c-axis. The resulting structural phase transition that drives the ferroelectric phase transition may be harnessed to couple to other phenomena, particularly magnetism.

Defects, granularity, and interface electronic structure are likely to play a key role in the switching process; therefore, with the goal of lowering the coercive field $E_c$, it is desirable to provide an electrode that enables h-LuFeO$_3$ with high structural perfection to be grown. The key role of the operating voltage (and consequently the energy dissipated) in computing and storage has been recently recognized and is thus driving the push to explore pathways to switch ferroelectrics at low voltages between 100-300 mV. Table 1 lists previously known (simulated or experimentally observed) coercive field $E_c$ values for hexagonal improper ferroelectric materials. As can be seen in Table 1 below, the lowest coercive field $E_c$ of h-LuFeO$_3$ previously found is 170 kV/cm for a 60 nm thick film. For comparison, the coercive field $E_c$ of bulk ferroelectric hexagonal manganites can be considerably lower, with YbMnO$_3$ having the lowest reported coercive field $E_c$ at 58 kV/cm. As with h-LuFeO$_3$, the ferroelectric polarization in these hexagonal manganites originates from the amplitude Q of the trimerization of the rare-earth ions. Typical Q values are listed in Table 1 and are estimated from the reported rare-earth displacement d as d=1.5Q. As Q of h-LuFeO$_3$ is comparable to other hexagonal improper ferroelectric materials, it is expected that the intrinsic coercive field E$_c$ of h-LuFeO$_3$ thin films should be comparable to the best hexagonal manganites, despite the values for the coercive field E$_c$ that have currently been reported.

TABLE 1

| Hexagonal Improper Ferroelectric | E$_c$ (kV/cm) | Temperature (K) | Rare-Earth Trimerization Amplitude Q (pm) |
|---|---|---|---|
| h-LuFeO$_3$ | 800 | 300 | 34 |
| h-LuFeO$_3$ | 170 | 100 | 31 |
| YbMnO$_3$ | 58 | 300 | 32 |
| ErMnO$_3$ | 300 | 150 | 31 |
| HoMnO$_3$ | 170 | 150 | 31 |
| YMnO$_3$ | 80 | 300 | 31 |

To approach the intrinsic coercive field E$_c$ of h-LuFeO$_3$ an epitaxial electrode is needed between the substrate and the thin film which is not only epitaxially lattice-matched to both, but also chemically stable and highly conductive; furthermore the matching of the electronic structure (i.e., valence and conduction band offsets at the interface) can play a critical role. Previously, sputtered (111)-oriented epitaxial platinum electrodes have been used. In order to deposit (001)-oriented h-LuFeO$_3$ on top of sputtered (111) Pt by molecular beam epitaxy (MBE), however, a 1.5 nm thick buffer layer of Lu$_2$O$_3$ (001) is needed as the surface quality of the sputtered platinum prevents direct growth of phase-pure h-LuFeO$_3$. In contrast, MBE-grown (111) Ir serves as an effective electrode upon which h-LuFeO$_3$ can be directly grown starting from the FeO monolayer.

This is due at least in part to the lattice matching between YSZ, iridium, and h-LuFeO$_3$. FIG. 2B illustrates a top view of the crystal structures of YSZ, iridium, and h-LuFeO$_3$ (bottom to top), where the growth direction points out of the page. FIG. 2C illustrates top views of the atomic arrangements of each of YSZ, iridium, and h-LuFeO$_3$. FIG. 2D illustrates an overlay of h-LuFeO$_3$ on iridium at the top and iridium on YSZ on the bottom. FIG. 2D highlights the 4:3 near-coincident site lattice match between the iridium bottom electrode and YSZ as well as the lattice match for h-LuFeO$_3$ and iridium. As shown, a lattice mismatch between h-LuFeO$_3$ and iridium may be approximately 4.8%. A lattice mismatch between iridium and YSZ may be approximately 0.75%.

Figure 3A:
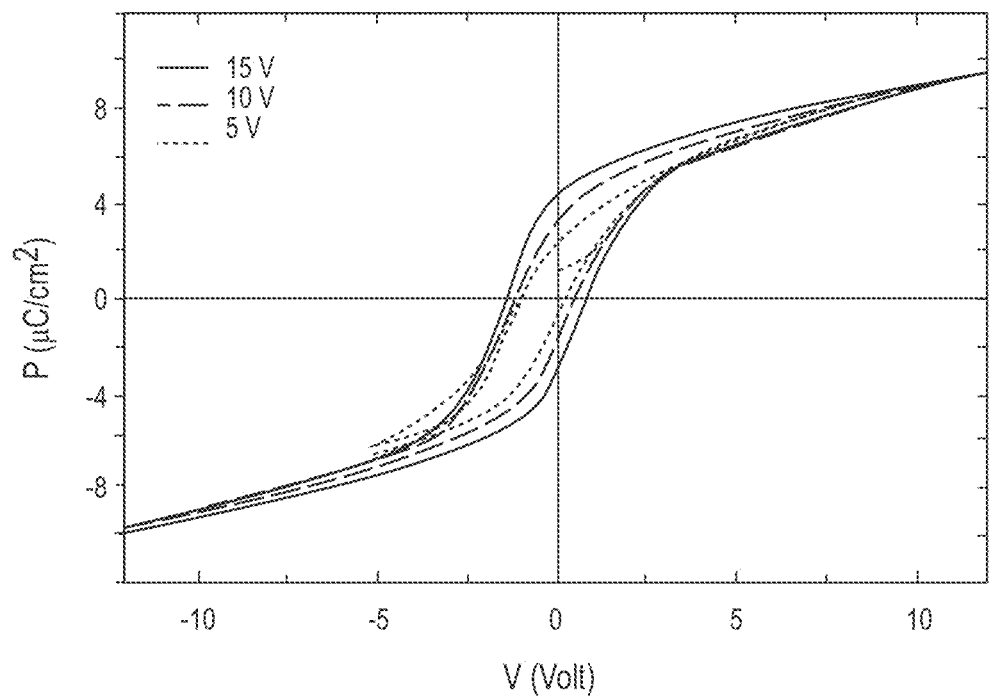
FIGS. 3A through 3D are graphs illustrating the performance of a ferroelectric device according to various embodiments of the present disclosure.
Figure 3B:
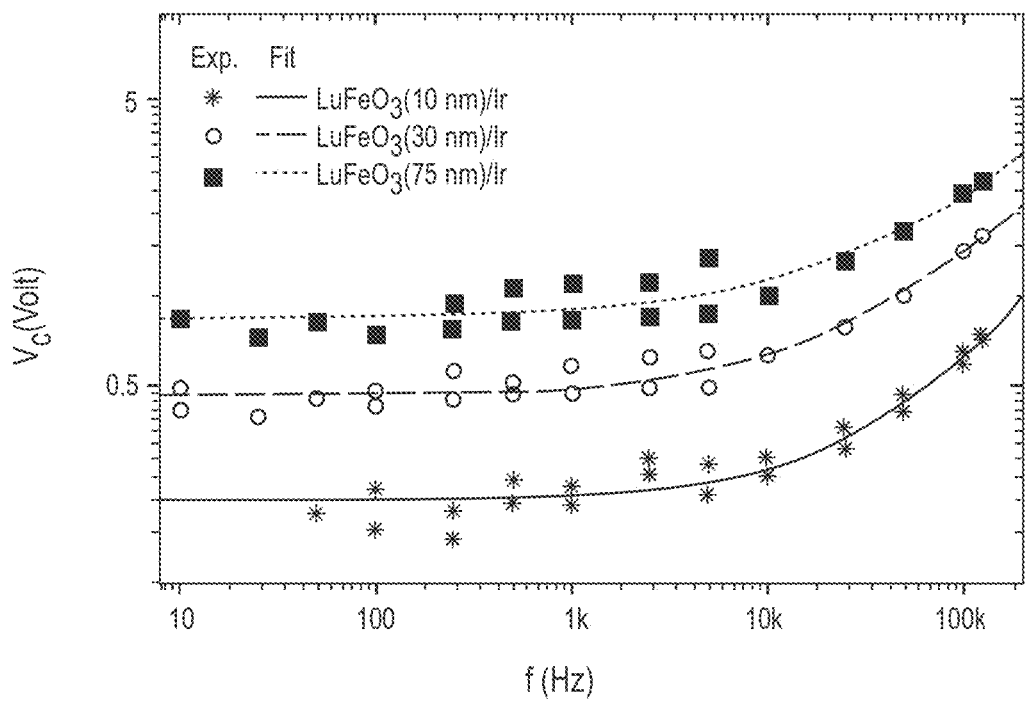

To determine the performance of the exemplary ferroelectric device 10 wherein the substrate 12 is YSZ, the first electrode 14 and the second electrode 18 are iridium, and the ferroelectric layer 16 is h-LuFeO$_3$, macroscopic measurements of the ferroelectric polarization, particularly focusing on the switching field were examined. A thickness series of h-LuFeO$_3$ ranging from 10 to 75 nm was grown between epitaxial iridium electrodes, patterned into MIM capacitors such as the exemplary ferroelectric device 10 with a range of diameters and tested using a standard ferroelectric testing protocol. Results of ferroelectric switching can be seen in FIG. 3. Ferroelectric measurements were carried out at 100 K to minimize leakage. In order to elucidate the polarization switching dynamics, the frequency dispersion of the ferroelectric hysteresis was studied from which the coercive field was extracted. A nominal family of voltage dependent hysteresis loops are shown in FIG. 3A. The frequency dispersion for three nominal thicknesses are shown in FIG. 3B. For all of the samples, the dispersion behavior exhibits a power-law dependence on the frequency captured by the relationship: $V_c = V_c(0) + af^b$, where $V_c(0)$ is the intercept on the vertical axis ($V_c$), f is the frequency and a and b are fitted parameters. This dependence of the switching field on the test frequency, $V_c \propto f^b$, has been observed for both proper and improper ferroelectrics. The asymptote of the power law dependence, $V_c(0)$ [or $E_c(0)$], is a measure of the quasi-static switching voltage (or electric field) and can be thought of as an intrinsic limit on the switching process and is related to the barrier height in the double well structure.

Figure 3C:
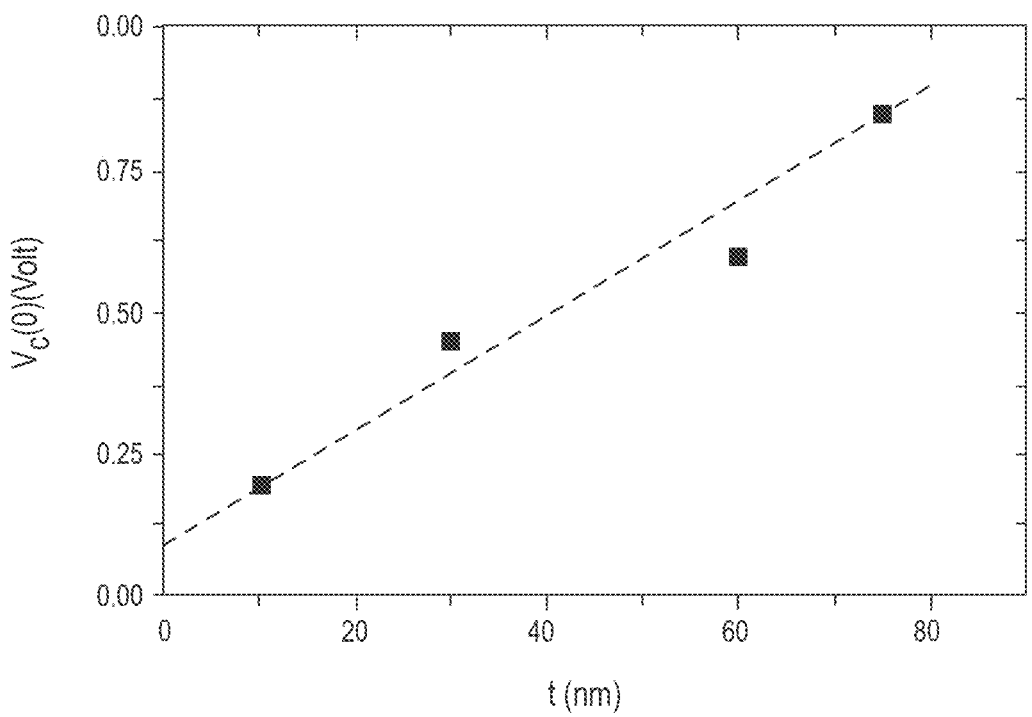

FIG. 3C illustrates a relationship between $V_c(0)$ and film thickness of the ferroelectric layer 16, t. It is noteworthy that the coercive field measured $$\left(E = \frac{V_c(0)}{t}\right),$$

of 99 kV/cm for the 60 nm thick h-LuFeO$_3$ film, is a significant improvement from the previously lowest 170 kV/cm on a 60 nm thick film of h-LuFeO$_3$ on indium-tin oxide electrodes referenced in Table 1.

Figure 3D:
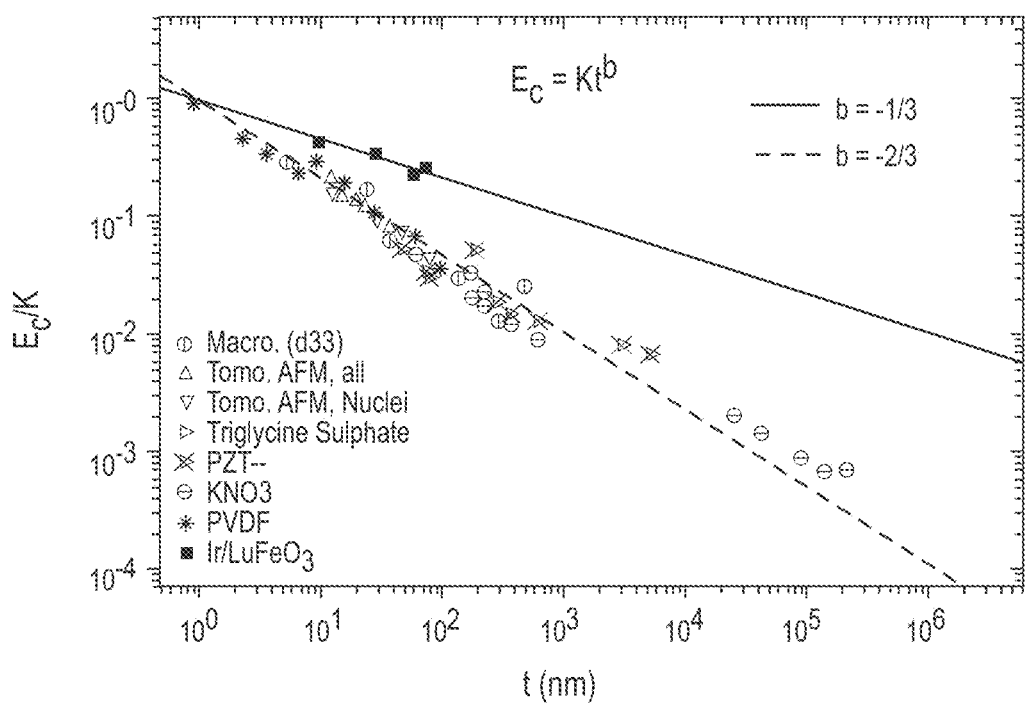

When the relationship between the coercivities of these improper ferroelectrics vs. thickness is examined as in FIG. 3D, surprisingly they do not follow the well-established Janovec-Kay-Dunn scaling relationship of proper ferroelectrics where $E_c \propto t^{-2/3}$. Instead they follow $E_c \propto t^{-1/3}$. As shown in FIG. 3D, a first line is plotted for each previously reported $$\frac{E_c}{K} vs.$$

t relationship, where K is a fitted value, while a second line illustrates the relationship for improper ferroelectrics such as h-LuFeO$_3$. This discrepancy in the scaling behavior hints at possible differences in domain wall motion during switching in improper ferroelectrics vs. proper ferroelectrics that has not been previously reported.

Deviations from the Janovec-Kay-Dunn scaling relationship have been found previously, especially in ultrathin films, but led to either no change in coercivity with thickness or an increase in the slope as thickness is decreased (an exponent with magnitude greater than −2/3). An exponent with magnitude lower then ~2/3 has previously been found, but resulted from a phase change with continual change in lattice parameter and a decrease in polarization with thickness. The relationship observed of $E_c \propto t^{-1/3}$ has not previously been observed in other systems, illustrating the unique properties of hexagonal improper ferroelectrics. The domain structure of these hexagonal improper ferroelectrics is known to differ significantly from proper ferroelectrics, specifically with the structural trimerization causing six distinct ferroelectric domains. This leads to a unique phenomenon including extremely thin domain walls, both neutral and charged domain walls, ferroelectric vortices, as well as topologically protected domains. Further, differences in energetic ratios for movement of domain walls versus the energy of the domain wall themselves have been noted in YMnO$_3$ vs. PbTiO$_3$. The unique properties of these improper ferroelectric domains undoubtedly account for the divergence from the Janovec-Kay-Dunn scaling law.

Table 2 illustrates values for the fit of coercive voltage MO) vs. frequency using the equation $E_c=E_c(0)+af^b$, where $V_c$ is the coercive voltage, $E_c(0)$ is the coercivity (or $V_c(0)$ divided by the thickness of the film), f is frequency, and a and b are fitted values.

TABLE 2

| t (nm) | $V_c(0)$ (volts) | $E_c(0)$ (kV/cm) | a | b |
|---|---|---|---|---|
| 10 | 0.194 | 194.1 | 0.006 | 0.871 |
| 30 | 0.449 | 149.6 | 0.027 | 0.731 |
| 60 | 0.595 | 99.1 | 0.238 | 0.517 |
| 75 | 0.851 | 113.4 | 0.026 | 0.688 |

Figure 4B:
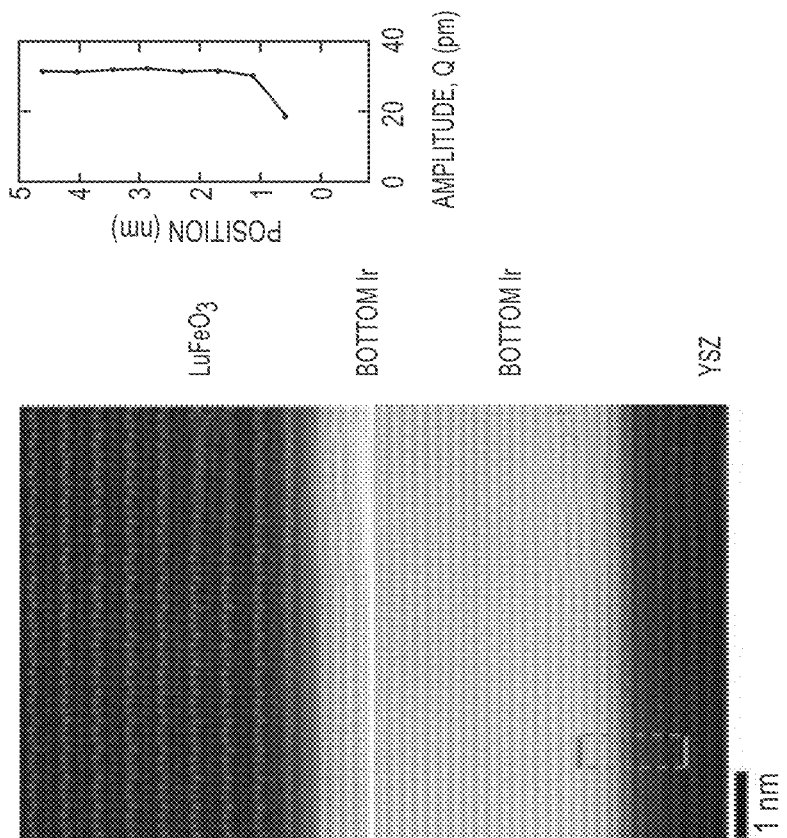
FIGS. 4A through 4D illustrate structural relationships between layers of materials for a ferroelectric device according to one embodiment of the present disclosure.
Figure 4A:
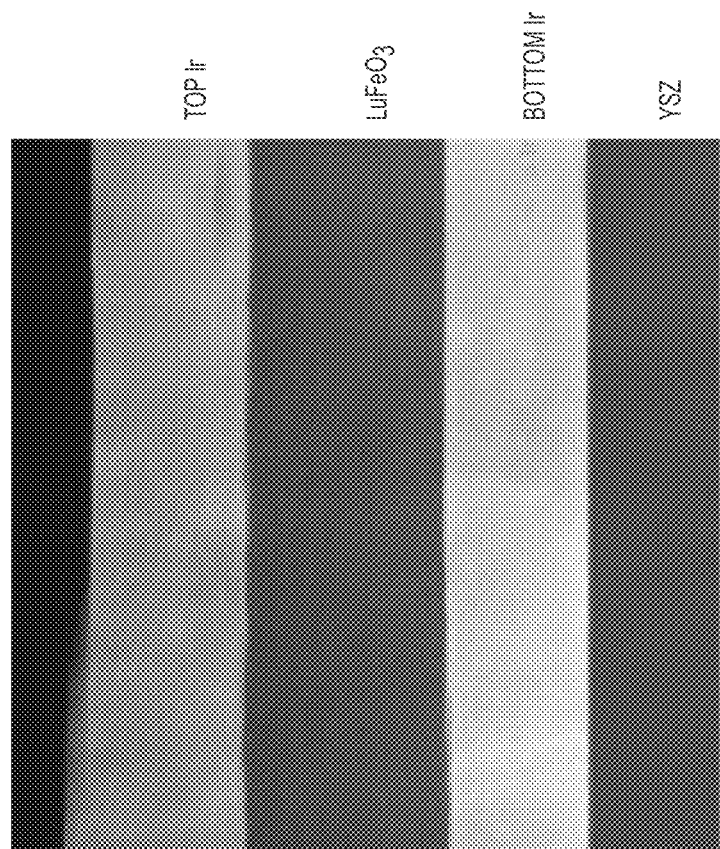

FIG. 4A shows a wide field of view image of an Ir/h-LuFeO$_3$/Ir capacitor such as the exemplary ferroelectric device 10, demonstrating that all layers are forming smoothly and without second phases or stacking faults. FIG. 4B shows the epitaxial interface between the YSZ and Ir. Strain fields are limited to the first few monolayers and no threading dislocations are observed in the rest of the iridium film; the array of misfit dislocations appears to be well confined to the interface between the substrate and film. The h-LuFeO$_3$ seen in FIG. 4B shows ferroelectric distortions even in the layers closest to the iridium electrode, with roughly 0.5 Å of interfacial reconstruction. No interdiffusion or oxidation of the iridium electrode is apparent at the h-LuFeO$_3$/Ir interface.

The spontaneous distortion of the Lu-atoms that leads to ferroelectricity can be quantified by the amplitude of trimerization, Q, measured from scanning transmission electron microscopy (STEM) images. This is plotted monolayer by monolayer in FIG. 4B (shown in the graph to the right of the image). The h-LuFeO$_3$ on iridium shows a remarkably clean interface compared to h-LuFeO$_3$ deposited directly on YSZ or Al$_2$O$_3$, where the misfit is large and the first monolayer is so disordered the Q value is close to zero. In contrast, when grown on epitaxial (111) Ir, the ferroelectric distortions appear in the first lutetium plane and reach the full distortion value by approximately the second or third monolayer. Bulk-like distortions are clearly present above one unit cell. The quick onset of ferroelectric distortions (structural evidence of geometric ferroelectricity) in these multiple-unit-cell thick films motivated us to characterize thinner samples to establish the thickness evolution of geometric ferroelectricity in h-LuFeO$_3$.

Figures 4C, 4D:
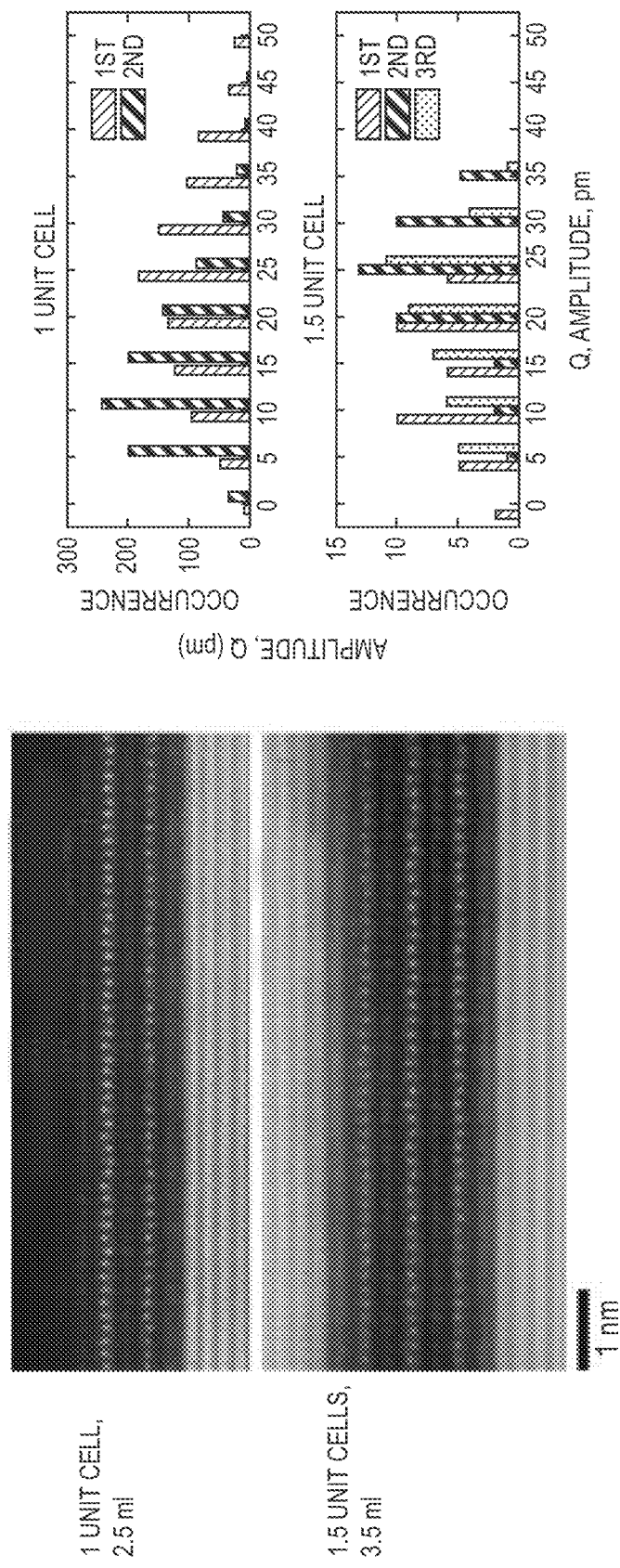

Even for extremely thin films of h-LuFeO$_3$ (all on iridium bottom electrodes) ranging from half a unit cell (one FeO plane and one LuO$_2$ plane, about 0.585 nm) to 4 unit cells (about 5 nm), STEM does not clearly show any ferroelectric distortions for a half-unit-cell thick freestanding film while for 1 unit cell and 1.5 unit cells the ferroelectric distortions of the lutetium atoms can be clearly seen as shown in FIG. 4C. FIG. 4D shows the histograms of the ferroelectric distortion Q as a function of the layering. Q is suppressed near the iridium top and bottom electrode, and larger in the second layer, although there is a wide distribution.

Figure 5A:
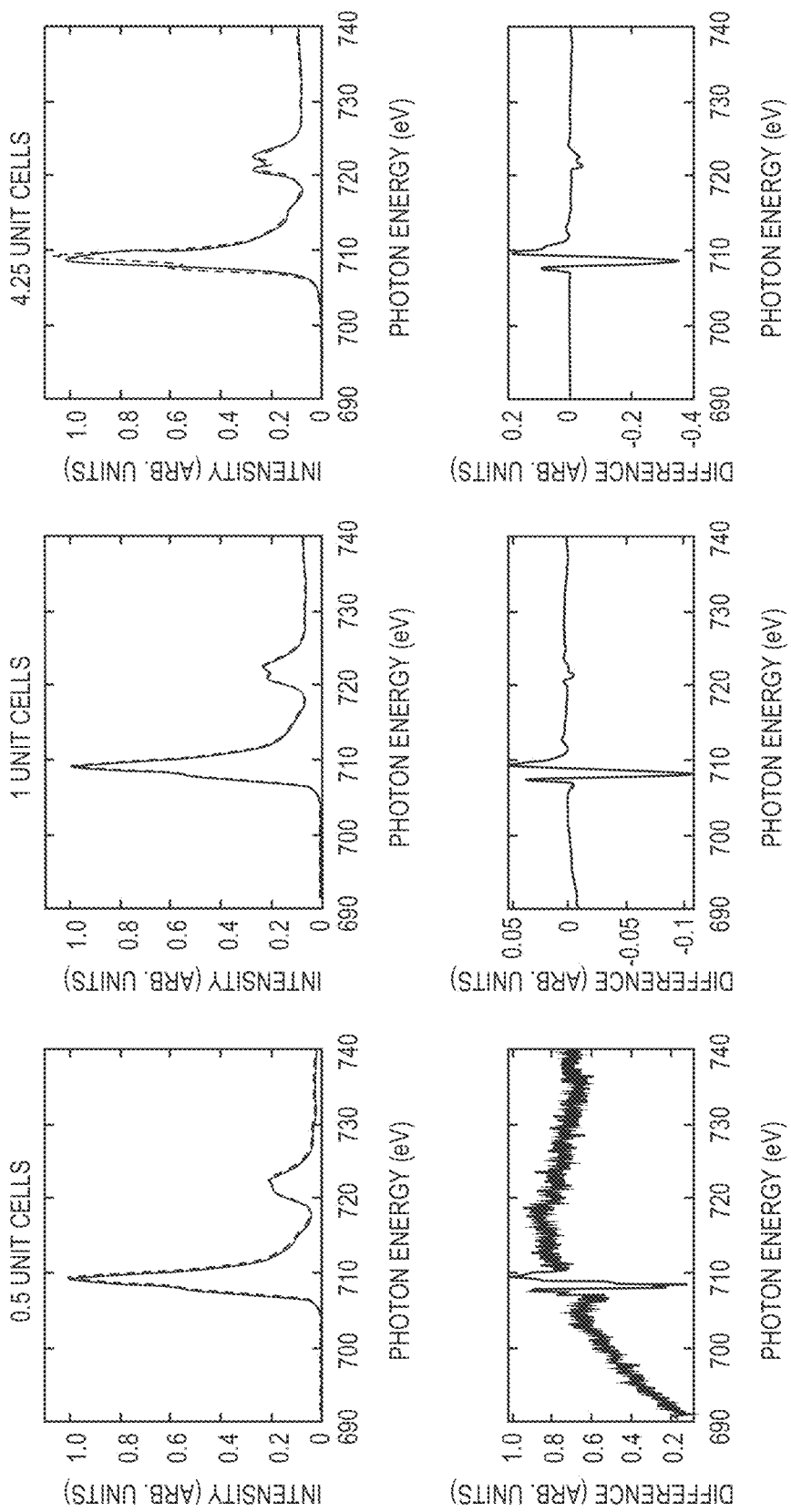
FIGS. 5A and 5B are graphs illustrating the performance of a ferroelectric device according to one embodiment of the present disclosure.
Figure 5B:
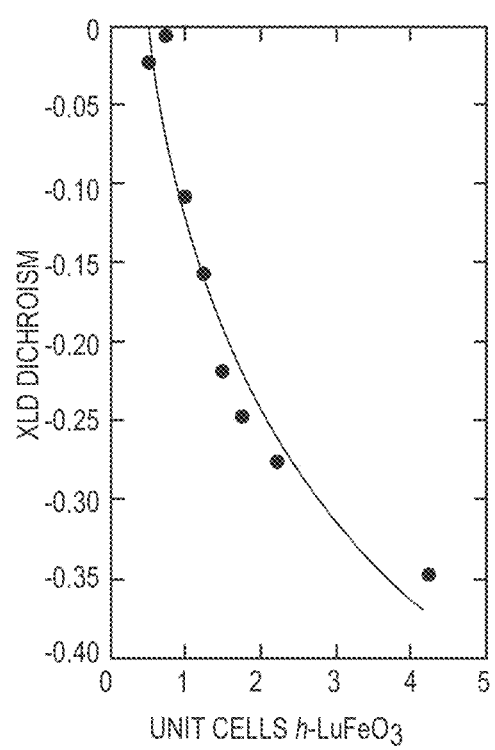

X-ray linear dichroism (XLD) validates the results from STEM. The room temperature XLD is shown in FIG. 5A as a function of h-LuFeO$_3$ thickness (0.5 unit cells on the left, 1 unit cell in the middle, and 4.25 unit cells on the right), where a solid line in the upper graph illustrates the measured intensity and the dashed line illustrates a natural logarithmic fit line. For half a unit cell (1 monolayer), a small, noisy signal is observed. For the 1 unit-cell-thick film, the dichroic signal is much stronger and has the same signature shape as bulk h-LuFeO$_3$, which increases in strength with thickness, as seen in the 4.25 unit-cell-thick sample. In h-LuFeO$_3$, the only asymmetries that contribute to the dichroic signal at room temperature are the ferroelectric distortions, indicating that by one unit cell there are ferroelectric structural distortions in the film, in agreement with the STEM analysis. FIG. 5B is a graph illustrating XLD dichroism vs unit cell thickness, further illustrating the relationship.

The onset of ferroelectricity can also be observed in situ during growth using reflection high-energy electron diffraction (RHEED), as illustrated in FIG. 6. FIG. 6A shows a RHEED image and line scans of RHEED intensity for a 4 unit-cell (u.c.) thick h-LuFeO$_3$ layer. FIG. 6B shows a RHEED image and line scans of RHEED intensity for a 1.5 unit-cell thick h-LuFeO$_3$ layer. As the ferroelectric structural rumpling of the lutetium atoms causes an in-plane tripling of the unit cell which appears in RHEED as streaks at ⅓ of the in-plane spacing of the paraelectric phase. It has previously been demonstrated for 20 to 60 nm thick films of h-LuFeO$_3$ grown on sapphire that the ferroelectric-to-paraelectric transition temperature, $T_c$, as determined with RHEED, is around 1050 K. This compares well to the ferroelectric transition temperature observed by Raman on 200 nm thick h-LuFeO$_3$ films ($T_c$=1020±50 K); the $T_c$ of bulk YMnO$_3$ is similarly high, $T_c$=1259±24 K.

The onset of geometric ferroelectricity can be observed with RHEED near the growth temperature (e.g., a thermocouple temperature of 850° C. (1125 K) or optical pyrometer temperature of about 1025 K) and during cooling. The $T_c$ of the ferroelectric phase is expected to be suppressed in ultrathin films even though ferroelectricity is observed at 1 unit cell at room temperature with STEM and XLD. Nonetheless, when h-LuFeO$_3$ is grown on iridium, the diffraction streaks corresponding to the ferroelectric phase appear at these elevated temperatures in films as thin as 1.5 unit cells. When h-LuFeO$_3$ is grown directly on YSZ, it does not clearly show the in-plane tripling at growth temperature even at 4 unit cells, but it does appear upon cooling at this thickness. This is further evidence that iridium, in addition to operating as a metallic electrode, also enables enhanced ferroelectric properties vs. conventional oxide substrates at these very small thicknesses. One of the reasons that iridium works so well could be the enhanced formation of domain walls in the h-LuFeO$_3$; these preexisting domain walls lower the energy barrier to switching, thus lowering $E_c$. These epitaxial iridium electrodes will likely also improve the properties of other hexagonal ferroelectrics, e.g., YMnO$_3$. The present disclosure thus applies not only to h-LuFeO$_3$, but also to other improper and/or hexagonal ferroelectrics such as h-LuMnO$_3$, h-YbMnO$_3$, h-ErMnO$_3$, h-HoMnO$_3$, h-YMnO$_3$, h-YbFeO$_3$, h-TmFeO$_3$, h-ErFeO$_3$, h-HoFeO$_3$, h-DyFeO$_3$, h-TbFeO$_3$, h-GdFeO$_3$, and h-EuFeO$_3$. The use of any of these hexagonal ferroelectrics for the ferroelectric layer 16 with the first electrode 14 and the second electrode 18 comprising iridium may prove beneficial. Further, while the present disclosure mainly discusses the use of YSZ for the substrate 12, other materials for the substrate such as (001)Al$_2$O$_3$, (001) sapphire, (111) SrTiO$_3$, (111) MgO, (111) MgAl$_2$O$_4$, (001) GaN, the 2H, 4H, and 6H polymorphs of (001) SiC, and the (111) orientation of the 3C polymorph of SiC may also be used for any of the embodiments discussed herein.

Utilizing an in-situ-grown epitaxial iridium electrode h-LuFeO$_3$ MIM devices down to 10 nm thickness can be ferroelectrically switched and result in very small coercive voltages, e.g., 194 mV for 10 nm. As the structural onset of ferroelectric distortions for h-LuFeO$_3$ deposited on iridium is as low as one unit cell, or 1.2 nm, confirmed by STEM and XLD analysis, further scaling should enable devices within the targeted 100-300 mV switching voltage which has been established as a design criteria to compete with and possibly replace current CMOS technology.

FIG. 7 illustrates RHEED images observed during growth of the bottom electrode and ferroelectric layer of the MIM structure, starting from the (111)-oriented YSZ substrate and followed by the deposition of the (111)-oriented iridium and (001)-oriented h-LuFeO$_3$ layers (bottom to top). The left three images illustrate the diffraction patterns seen with the RHEED electron beam incident along the [110] direction of YSZ, [110] direction of iridium, and [120] direction of h-LuFeO$_3$. The right three images illustrate the diffraction patterns seen with the RHEED electron beam incident along the [211] direction of YSZ, [211] direction of iridium, and [110] direction of h-LuFeO$_3$. The clear streaks in FIG. 7 illustrate good crystalline quality, smooth surface and in-plane epitaxial relationships of both the iridium electrode and h-LuFeO$_3$ film. Third order streaks, which are indicated by arrows in the upper-right image, arise from the trimerization distortion of h-LuFeO$_3$ along the [110] direction of the h-LuFeO$_3$ film. This rumpling distortion is the signature of the geometric ferroelectric phase.

FIG. 8 illustrates atomic force microscopy (AFM) of each layer in the exemplary ferroelectric device 10. FIG. 8A illustrates a bare (111) oriented YSZ substrate, with root means square roughness of approximately 76.3 pm. FIG. 8B illustrates a 20 nm thick (111) oriented iridium layer on top of a YSZ substrate, with root means square roughness of approximately 231 pm. FIG. 8C illustrates a 60 nm thick h-LuFeO$_3$ layer on the iridium layer with root means square roughness of approximately 756 pm. The minor increase in rms roughness in the iridium electrode as well as the remnants of the texture from the unit cell steps from the substrate indicate the extreme smoothness of the iridium electrode. The h-LuFeO$_3$ which is then deposited has comparable roughness to that grown directly on a (111) YSZ substrate.

FIG. 9 illustrates XRD data for the exemplary ferroelectric device 10 wherein the substrate 12 is YSZ, the first electrode 14 is iridium with a thickness of 20 nm, and the ferroelectric layer 16 is h-LuFeO$_3$ with a thickness of 150 nm. Specifically, FIG. 9A shows a 2θ-ω scan, FIG. 9B illustrates overlaid ω rocking curves, specifically the 111 YSZ, 111 iridium, and 002 h-LuFeO$_3$ peaks, and FIG. 9C illustrates φ scans of the stack with corresponding stereographic projections of the expected peaks in a single crystal, specifically the 002 YSZ, 002 iridium, and 112 h-LuFeO$_3$ family of peaks. The θ-2θ scan shows the expected peaks from (111) iridium and (001) h-LuFeO$_3$ with no detectable impurity phases. The ω rocking curves assess the structural perfection. The full width at half maximum (FWHM) of the 111 iridium peak is 0.23° and of the 002 h-LuFeO$_3$ peak is 0.47°, both large compared to the substrate FWHM of 0.02°. Still, the FWHM of the h-LuFeO$_3$ grown on this electrode is comparable to that for h-LuFeO$_3$ grown directly on YSZ, showing the unique advantage of using single-crystal epitaxial iridium electrodes. When the φ scans are compared to the stereographic projections of poles of a single crystal, they demonstrate the twin-free single-crystal nature of both the iridium and h-LuFeO$_3$ as well as the in-plane epitaxial relationships shown in FIG. 2.

FIG. 10 illustrates STEM data comparing the interfaces of h-LuFeO$_3$ grown on an iridium electrode vs. on a (111) oriented YSZ substrate. FIG. 10A illustrates the interface of h-LuFeO$_3$ grown on an iridium substrate. FIG. 10B illustrates the interface of h-LuFeO$_3$ grown on a (111) oriented YSZ substrate. FIG. 10C illustrates Q amplitude of lutetium-ion distortion divided by Q in the bulk of the film calculated monolayer-by-monolayer for h-LuFeO$_3$ grown on iridium and (111) oriented YSZ, respectively. FIG. 10D illustrates STEM x-ray energy dispersive spectroscopy (EDS) line profiles across the YSZ, iridium, and h-LuFeO$_3$ layers. The YSZ/iridium/h-LuFeO$_3$ interfaces are sharp, limited by the probe and beam broadening, and show no interdiffusion into the iridium layer.

For epitaxial growth, a clean interface that is abrupt and free of reaction between adjacent layers is desired. Usually, growth on a similar crystal structure with a small lattice mismatch is preferred for good quality epitaxial films. Unfortunately, there are no commercially available isostructural substrates for h-LuFeO$_3$, and since it is hexagonal the choices are limited. Nevertheless, (111) YSZ and (001) Al$_2$O$_3$ have become the standard choices. However, iridium enables a cleaner interface for h-LuFeO$_3$ growth than does (111) YSZ. No oxidation of the iridium is observed, both as evidenced from the apparent crystal structure of the iridium at the interface as observed by STEM and from elemental mapping by x-ray energy dispersive spectroscopy as discussed above. When h-LuFeO$_3$ is grown on iridium the first monolayer of lutetium has a non-zero Q value indicating ferroelectric distortions, and by the second monolayer the distortions are similar to the bulk of the film. When h-LuFeO$_3$ is grown directly on (111) YSZ the first monolayer of lutetium results in a Q value very near to zero. The second monolayer of lutetium (positioned around 1 nm) then has a similar Q value to the first monolayer of h-LuFeO$_3$ grown on iridium.

FIG. 11 illustrates a STEM analysis of the ferroelectric domain structure of h-LuFeO$_3$. FIG. 11A illustrates STEM images, which shows up polarization on the left and down polarization on the right, where a slight lack of intensity in the banding separates the two. FIG. 11B are histograms of the phase and Q trimerization parameter. FIG. 11C is a plot showing the intensity of all six domain configurations.

Another difference between h-LuFeO$_3$ grown on Ir/(111) YSZ vs. directly on (111) YSZ or (001) Al$_2$O$_3$ is that the as-grown film on iridium has both up and down polarization domains, i.e., the spontaneous polarization of the h-LuFeO$_3$ is oriented along either [001] or [00$\bar{1}$]. This observation is in contrast to prior work in which h-LuFeO$_3$ grown directly on (111) YSZ and (001) Al$_2$O$_3$ was observed to usually form as only a single, polarization-up domain; this behavior may be due to surface charge effects. As shown in FIG. 11A, both the up and down domain are present, with the domain wall originating near a step-edge in the iridium electrode. By measuring the ferroelectric order parameter from sinusoidal fitting of the atomic columns, statistics from many images can be compiled, showing that the film has a trimerization distortion comparable to bulk hexagonal manganites and shows a similar energy landscape for domain occupation as to what is observed in bulk. The presence of preexisting domain walls lowers the energy barrier to the switching process and could be part of the reason that iridium is such a good electrode for h-LuFeO$_3$ with low E$_c$.

FIG. 12 illustrates a Raman spectra of h-LuFeO$_3$ of different thicknesses on iridium-coated YSZ and a bare (111) oriented YSZ substrate for comparison. The arrow indicates the strongest A1 phonon peak of h-LuFeO$_3$. The 60 nm thick sample shows a strong peak of the A1 mode at 650 cm$^{-1}$, corresponding to ferroelectric order as well as many additional phonon modes of h-LuFeO$_3$. This is similar to previous Raman spectra of h-LuFeO$_3$ taken on thick films.

Going thinner, the peak from the A1 mode is still observed in the 5 nm thick film (arrow), but the signal from the YSZ substrate is starting to dominate. In the 1.8 nm thick film the only observable signal is from the substrate, which unfortunately has a large peak in the vicinity of the A1 mode peak. Due to the extraneous signal from the substrate, UV Raman spectroscopy was not able to distinguish the ferroelectric signal of extremely thin films on YSZ substrates.

FIG. 13 illustrates XLD data for various thicknesses of h-LuFeO$_3$ on iridium-coated YSZ. Specifically, FIGS. 13A through 13I illustrate XLD data where the h-LuFeO$_3$ layer is between 1 monolayer and 60 nm thick as annotated. Each series of graphs illustrates intensity and difference in arbitrary units (a.u.) and asymmetry as a percentage vs photon energy. The thickness of the h-LuFeO$_3$ was increased in increments of a single monolayer (one FeO plane and one LuO$_2$ plane, half a unit cell). At a thickness below one unit cell (2 monolayers) the XLD signal is noisy and the shape of the difference and symmetry is not consistent with the thicker films. In contrast, at and beyond 1 unit cell (2 monolayers) even though the difference signal is small, the shape is consistent with the thicker films showing that the onset of ferroelectricity occurs at a single unit cell.

FIG. 14 is a flow diagram illustrating a method for manufacturing a ferroelectric device according to one embodiment of the present disclosure. In FIG. 14, a substrate is provided (step 100). The substrate may comprise YSZ, and in particular (111) oriented 9.5 mol % YSZ single crystals in some embodiments. The substrate is planarized (step 102). In one embodiment, planarizing the substrate comprises annealing the substrate in air at approximately 1300° C. for approximately 3 hours to obtain a smooth surface and unit-cell-high steps. In other embodiments, the substrate may be annealed at lower temperatures for longer times or at higher temperatures for shorter times. For example, the substrate may be annealed at a temperature between 1000° C. and 1300° C. for 2-8 hours. This may be dependent on the material of the substrate, which as discussed above may be YSZ but also may be one of (001) Al$_2$O$_3$, (001) sapphire, (111) SrTiO$_3$, (111) MgO, (111) MgAl$_2$O$_4$, (001) GaN, the 2H, 4H, and 6H polymorphs of (001) SiC, and the (111) orientation of the 3C polymorph of SiC. A first electrode is provided on the substrate (step 104). In one embodiment, the first electrode is iridium, and specifically (111) oriented iridium. Providing the first electrode may comprise depositing the electrode via MBE. In one embodiment, depositing the first electrode comprises vaporizing iridium to provide an iridium flux at the substrate measured with quartz crystal microbalances between $1 \times 10^{13}$ and $6 \times 10^{13}$ atoms cm$^{-2}$ s$^{-1}$, and preferably between $3 \times 10^{13}$ and $4 \times 10^{13}$ atoms cm$^{-2}$ s$^{-1}$. During deposition of the first electrode the substrate may be held at a temperature between 150° C. and 400° C., and preferably about 375° C., as measured by a thermocouple. A hexagonal ferroelectric material layer is deposited on the single crystal epitaxial electrode (step 106). In one embodiment, the hexagonal ferroelectric material is h-LuFeO$_3$. Depositing the hexagonal ferroelectric material may comprise shuttering iron and lutetium molecular beams sequentially to provide doses of these cations onto the iridium in the same monolayer-by-monolayer sequence in which they occur along the [001] direction of h-LuFeO$_3$ as shown in FIG. 2. The substrate may be kept at a temperature between 750° C. and 825° C., and preferably approximately 775° C., as measured by an optical pyrometer operating at a wavelength of 980 nm during deposition of the hexagonal ferroelectric material layer. The lutetium and iron fluxes may both be between $1 \times 10^{13}$ and $2.5 \times 10^{13}$ atoms cm$^{-2}$ s$^{-1}$, and more preferably approximately $2 \times 10^{13}$ atoms cm$^{-2}$ s$^{-1}$. A second electrode may be provided on the hexagonal ferroelectric material layer (step 108). The second electrode may be deposited similarly to the first electrode described above, except that the substrate may be held at a temperature between 150° C. and 400° C., and preferably 200° C., as measured with a thermocouple. During deposition of the first electrode, the hexagonal ferroelectric material layer, and the second electrode, an oxidant mixture of approximately 90% oxygen and 10% ozone may be provided in a chamber while the entire structure is held in vacuum. The various parts of the structure may be provided without breaking vacuum. In various embodiments, deposition of the hexagonal ferroelectric material layer may be initiated by depositing a monolayer of iron oxide and then alternating layers of LuO$_2$ and FeO. If lutetium is deposited first or if the h-LuFeO$_3$ is co-deposited, an interaction may occur between the iridium of the first electrode and the lutetium forming a second phase that can be observed in RHEED. FeO may also be used to terminate the h-LuFeO$_3$ layer before depositing the second electrode to avoid similar interactions.

During deposition, iridium forms with an in-plane orientation relationship of $[1\bar{1}0]_{Ir} \| [1\bar{1}0]_{YSZ}$ and $[2\bar{1}\bar{1}]_{Ir} \| [2\bar{1}\bar{1}]_{YSZ}$. Since the lattice parameter of iridium (0.389 nm) is much smaller than that of YSZ, (0.5140 nm), it forms with a near-coincident site lattice in which four repeats along [1$\bar{1}$0]$_{Ir}$ match with three repeats along [1$\bar{1}$0]$_{YSZ}$. This results in a small lattice mismatch for the near-coincident site lattice unit cell of only 0.75%, as confirmed by STEM imaging. The h-LuFeO$_3$ then grows with an in-plane orientation relationship of $[120]_{LuFeO_3} \| [1\bar{1}0]_{Ir}$, resulting in a 4.8% lattice mismatch. Iridium therefore provides a better match to h-LuFeO$_3$ than YSZ or platinum, which results in lattice mismatches of 5.6% and 7%, respectively. Four-circle X-ray diffraction (XRD) confirms that the iridium and h-LuFeO$_3$ are single crystal and have the expected orientations and epitaxial relationships as described.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A ferroelectric device comprising:
   a substrate that comprises yttria-stabilized zirconia (YSZ) crystal;
   a first electrode directly on the substrate, the first electrode comprising a single crystal epitaxial material;
   a hexagonal ferroelectric material layer directly on the first electrode; and
   a second electrode directly on the hexagonal ferroelectric material layer such that the hexagonal ferroelectric material is between the first electrode and the second electrode, wherein the second electrode is a single crystal epitaxial material.

2. The ferroelectric device of claim 1 wherein the hexagonal ferroelectric material layer comprises hexagonal LuFeO$_3$.

3. The ferroelectric device of claim 2 wherein the first electrode comprises iridium.

4. The ferroelectric device of claim 3 wherein the first electrode comprises (111) oriented iridium.

5. The ferroelectric device of claim 1 wherein the second electrode comprises iridium.

6. The ferroelectric device of claim 1 wherein the hexagonal ferroelectric material layer comprises one or more of h-LuMnO$_3$, h-YbMnO$_3$, h-ErMnO$_3$, h-HoMnO$_3$, h-YMnO$_3$, h-YbFeO$_3$, h-TmFeO$_3$, h-ErFeO$_3$, h-HoFeO$_3$, h-DyFeO$_3$, h-TbFeO$_3$, h-GdFeO$_3$, and h-EuFeO$_3$.

7. The ferroelectric device of claim 6 wherein the first electrode comprises iridium.

8. A method for manufacturing a ferroelectric device according to claim 1, the method comprising:
   planarizing a surface of the substrate;
   depositing the first electrode on the surface of the substrate, wherein the first electrode is a single crystal epitaxial material;
   depositing the hexagonal ferroelectric material layer directly on the first electrode; and
   depositing the second electrode on the hexagonal ferroelectric material layer.

9. The method of claim 8 wherein the hexagonal ferroelectric material layer comprises hexagonal LuFeO$_3$.

10. The method of claim 9 wherein the first electrode comprises iridium.

11. The method of claim 10 wherein depositing the first electrode and depositing the hexagonal ferroelectric material layer are performed via molecular beam epitaxy (MBE).

12. The method of claim 11 wherein depositing the first electrode on the surface of the substrate comprises providing an iridium flux at the substrate between $1\times10^{13}$ atoms/cm$^2$/s and $6\times10^{13}$ atoms/cm$^2$/s.

13. The method of claim 12 wherein depositing the hexagonal ferroelectric material layer comprises providing sequentially shuttering lutetium and iron molecular beams with a flux between $1\times10^{13}$ and $2.5\times10^{13}$ atoms/cm$^2$/s such that doses of the lutetium and iron are provided in the same monolayer-by-monolayer sequence in which they occur along the [001] direction of h-LuFeO$_3$.

14. The method of claim 13 wherein depositing the hexagonal ferroelectric material layer comprises providing an initial monolayer of FeO on the first electrode before sequentially shuttering the lutetium and iron molecular beams.

15. The method of claim 14 wherein planarizing the substrate comprises annealing the substrate in air at a temperature of at least 1000° C. for at least 2 hours.

16. The method of claim 13 wherein depositing the first electrode and depositing the hexagonal ferroelectric material layer are performed in a constant vacuum.

17. The method of claim 16 wherein during deposition of the first electrode and the hexagonal ferroelectric material layer a mixture of oxygen and approximately 10% ozone is supplied continuously at a background pressure of $1\times10^{-6}$ Torr.

* * * * *